US011942053B2

(12) United States Patent
Qin et al.

(10) Patent No.: US 11,942,053 B2
(45) Date of Patent: Mar. 26, 2024

(54) DISPLAY PANEL WITH TRANSISTORS AND SUB-PIXELS, AND DISPLAY DEVICE WITH DISPLAY PANEL

(71) Applicants: Beijing BOE Optoelectronics Technology Co., Ltd., Beijing (CN); BOE Technology Group Co., Ltd., Beijing (CN)

(72) Inventors: Xianglei Qin, Beijing (CN); Jian Lin, Beijing (CN); Yong Zhang, Beijing (CN); Limin Zhang, Beijing (CN); Zepeng Sun, Beijing (CN); Zhichao Yang, Beijing (CN); Liangzhen Tang, Beijing (CN); Zhilong Duan, Beijing (CN); Honggui Jin, Beijing (CN); Yashuai An, Beijing (CN); Lingfang Nie, Beijing (CN); Jian Wang, Beijing (CN); Li Tian, Beijing (CN); Jing Pang, Beijing (CN); Xuechao Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 17/755,302

(22) PCT Filed: Feb. 20, 2020

(86) PCT No.: PCT/CN2020/076078
§ 371 (c)(1),
(2) Date: Apr. 26, 2022

(87) PCT Pub. No.: WO2021/163976
PCT Pub. Date: Aug. 26, 2021

(65) Prior Publication Data
US 2022/0375420 A1 Nov. 24, 2022

(51) Int. Cl.
*G09G 3/36* (2006.01)
*G02F 1/1362* (2006.01)
(Continued)

(52) U.S. Cl.
CPC ..... *G09G 3/3607* (2013.01); *G02F 1/136286* (2013.01); *G02F 1/1368* (2013.01);
(Continued)

(58) Field of Classification Search
CPC ............... G09G 3/3607; G09G 3/3688; G09G 2330/021; G02F 1/136286; G02F 1/1368; H01L 27/124
See application file for complete search history.

(56) References Cited

U.S. PATENT DOCUMENTS

2006/0022202 A1* 2/2006 Yu ........................ G02F 1/13624
257/72
2018/0197495 A1* 7/2018 Xu ........................ G09G 3/3655

FOREIGN PATENT DOCUMENTS

CN 1278073 A 12/2000
CN 1831927 A 9/2006
(Continued)

OTHER PUBLICATIONS

First Office Action, CN Application No. 202080000156.3, dated May 26, 2022.

*Primary Examiner* — Lisa S Landis
(74) *Attorney, Agent, or Firm* — Workman Nydegger

(57) ABSTRACT

Disclosed are a display panel and a driving method therefor, and a display device. Two adjacent rows of sub-pixels are taken as a row group, and the row group is provided with a first sub row group and a second sub row group that are arranged in a column direction; a gate electrode of a first transistor in the first sub row group is electrically connected to a first gate line; a gate electrode of a second transistor in
(Continued)

the second sub row group is electrically connected to a second gate line; two adjacent sub-pixels in the column direction share one third transistor, and a gate electrode of the third transistor in the row group is electrically connected to a third gate line; and the first transistor and the second transistor in one column of sub-pixels are electrically connected to a data line by means of the shared third transistor.

18 Claims, 14 Drawing Sheets

(51) Int. Cl.
*G02F 1/1368* (2006.01)
*H01L 27/12* (2006.01)

(52) U.S. Cl.
CPC ......... *G09G 3/3688* (2013.01); *H01L 27/124* (2013.01); *G09G 2330/021* (2013.01)

(56) References Cited

FOREIGN PATENT DOCUMENTS

| | | |
|---|---|---|
| CN | 106502015 A | 3/2017 |
| CN | 107167973 A | 9/2017 |
| CN | 108227284 A | 6/2018 |
| CN | 108646480 A | 10/2018 |
| CN | 108732806 A | 11/2018 |
| CN | 108828850 A | 11/2018 |
| CN | 109767739 A | 5/2019 |
| JP | 05265045 A | 10/1993 |

* cited by examiner

DISPLAY PANEL WITH TRANSISTORS AND SUB-PIXELS, AND DISPLAY DEVICE WITH DISPLAY PANEL

The present disclosure is a National Stage of International Application No. PCT/CN2020/076078, filed on Feb. 20, 2020, which is incorporated herein by reference.

FIELD

The present disclosure relates to the technical field of display, in particular to a display panel and a driving method therefor, and a display device.

BACKGROUND

With the continuous development of display technologies, a half-transmission half-reflection display panel is widely applied in display devices such as mobile phones and tablet computers due to its advantages of low power consumption, high environment adaptiveness and the like.

SUMMARY

An embodiment of the present disclosure provides a display panel, including: a base substrate; a plurality of sub-pixels on the base substrate, wherein at least one of the plurality of sub-pixels includes a pixel electrode; a plurality of transistors, including a plurality of first transistors, a plurality of second transistors and a plurality of third transistors; a plurality of data lines, disposed on the base substrate at intervals; and a plurality of gate lines, disposed on the base substrate at intervals, and including a plurality of first gate lines, a plurality of second gate lines and a plurality of third gate lines; wherein two adjacent rows of sub-pixels are taken as a row group, and the row group has a first sub row group and a second sub row group arranged in a column direction; the pixel electrode includes a first pixel electrode and a second pixel electrode; one sub-pixel in the first sub row group includes one first transistor of the plurality of first transistors and one first pixel electrode; wherein a gate electrode of the first transistor in the first sub row group is electrically connected with one first gate line of the plurality of first gate lines; in the same sub-pixel, a second electrode of the first transistor is electrically connected with the first pixel electrode; one sub-pixel in the second sub row group includes one second transistor of the plurality of second transistors and one second pixel electrode; wherein a gate electrode of the second transistor in the second sub row group is electrically connected with one second gate line of the plurality of second gate lines; in the same sub-pixel, a second electrode of the second transistor is electrically connected with the second pixel electrode; in the same row group, two adjacent sub-pixels in the column direction share one third transistor of the plurality of third transistors; wherein a gate electrode of the third transistor in the row group is electrically connected to one third gate line of the plurality of third gate lines; and the first transistor and the second transistor in one column of sub-pixels are electrically connected with one data line of the plurality of data lines through the shared third transistor.

Optionally, in the embodiment of the present disclosure, in the same row group, two adjacent sub-pixels in the column direction constitute one sub-pixel group; and the sub-pixel group is configured to be at least a part of a region of one pixel point in a display image.

Optionally, in the embodiment of the present disclosure, an active layer of the third transistor includes a first source electrode region, a first drain electrode region, a second drain electrode region, a first channel region and a second channel region; wherein the first channel region is between the first source electrode region and the first drain electrode region, and the second channel region is between the first source electrode region and the second drain electrode region; and the first source electrode region is electrically connected with the data line, the first drain electrode region is electrically connected with a first electrode of the first transistor, and the second drain electrode region is electrically connected with a first electrode of the second transistor.

Optionally, in the embodiment of the present disclosure, the display panel further includes: a source conducting layer on the base substrate, and including the plurality of data lines disposed at intervals, a plurality of source connecting parts, a plurality of first source electrode parts and a plurality of second source electrode parts; wherein one source connecting part, one first source electrode part and one second source electrode part are in one sub-pixel group; the first source electrode part serves as the first electrode of the first transistor, and the second source electrode part serves as the first electrode of the second transistor; and in the same sub-pixel group, the first source electrode part is electrically connected with the first drain electrode region, the second source electrode part is electrically connected with the second drain electrode region, the first source electrode region is electrically connected with the source connecting part, and the source connecting part is electrically connected with one data line.

Optionally, in the embodiment of the present disclosure, each of the source connecting parts comprises: a first sub source connecting part and a second sub source connecting part electrically connected with each other; wherein the first sub source connecting part extends in a row direction, and the second sub source connecting part extends in the column direction; and the first sub source connecting part is electrically connected with the data line, and the second sub source connecting part is electrically connected with the first source electrode region.

Optionally, in the embodiment of the present disclosure, the pixel electrode is set as a reflecting electrode; and the first pixel electrode is provided with a first through hole, the second pixel electrode is provided with a second through hole, and an area of the first through hole is different from an area of the second through hole.

Optionally, in the embodiment of the present disclosure, the base substrate has: a first partition and a second partition; wherein the first partition covers one sub-pixel in the sub-pixel group, and the second partition covers another sub-pixel in the sub-pixel group; and the display panel further includes: an opposite substrate, disposed opposite to the base substrate; and a color resistance layer between the base substrate and the opposite substrate, including sub color resistance layers in the sub-pixels; wherein each of the sub color resistance layers has a first sub color resistance region and a second sub color resistance region, and in a direction perpendicular to a plane where the base substrate is located, the first partition covers the first sub color resistance regions, and the second partition covers the second sub color resistance region.

Optionally, in the embodiment of the present disclosure, the first pixel electrode has a first facing area with the sub color resistance layer in the first sub color resistance region; the second pixel electrode has a second facing area with the sub color resistance layer in the second sub color resistance region; and in the same sub-pixel group, the first facing area is different from the second facing area.

Optionally, in the embodiment of the present disclosure, in the same sub-pixel group, an area of the first pixel electrode is substantially the same as an area of the second pixel electrode, and an area of the first sub color resistance region is smaller than an area of the second sub color resistance region.

Optionally, in the embodiment of the present disclosure, the sub color resistance layer in the first partition is provided with a first via hole, and the first via hole penetrates through the sub color resistance layer; and an orthographic projection of the first via hole on the base substrate does not overlap with an orthographic projection of the first through hole on the base substrate.

Optionally, in the embodiment of the present disclosure, in the same sub-pixel group, an area of the first pixel electrode is smaller than an area of the second pixel electrode, and an area of the first sub color resistance region is smaller than or substantially the same as an area of the second sub color resistance region.

Optionally, in the embodiment of the present disclosure, the orthographic projection of the first through hole on the base substrate does not overlap with orthographic projections of the source conducting layer and a gate conducting layer on the base substrate; and an orthographic projection of the second through hole on the base substrate does not overlap with the orthographic projections of the source conducting layer and the gate conducting layer on the base substrate.

Optionally, in the embodiment of the present disclosure, for the first gate line and the first pixel electrode electrically connected with the first transistor, orthographic projections of the first gate line and the first transistor on the base substrate have overlapping regions with an orthographic projection of the first pixel electrode on the base substrate; and/or for the second gate line and the second pixel electrode electrically connected with the second transistor, orthographic projections of the second gate line and the second transistor on the base substrate have overlapping regions with an orthographic projection of the second pixel electrode on the base substrate; and/or an orthographic projection of the third gate line on the base substrate has overlapping regions with the orthographic projections of the third transistor electrically connected with the third gate line, the first pixel electrode and the second pixel electrode on the base substrate.

Optionally, in the embodiment of the present disclosure, the first pixel electrode is provided with one first through hole, and the second through hole includes a first sub through hole and a second sub through hole disposed at intervals; for one sub-pixel group, an orthographic projection of the first sub through hole on the base substrate is closer to an orthographic projection of the data line electrically connected with the sub-pixels on the base substrate relative to an orthographic projection of the second sub through hole on the base substrate; and/or for one sub-pixel group, an orthographic projection of the second sub through hole on the base substrate is farther away from the orthographic projection of the data line electrically connected with the sub-pixels on the base substrate relative to the orthographic projection of the first sub through hole on the base substrate.

Optionally, in the embodiment of the present disclosure, the orthographic projection of the first sub through hole on the base substrate is between an orthographic projection of the first sub source connecting part on the base substrate and an orthographic projection of the data line on the base substrate, and the orthographic projection of the first sub through hole on the base substrate is between an orthographic projection of the second sub source connecting part on the base substrate and an orthographic projection of the third gate line on the base substrate.

Optionally, in the embodiment of the present disclosure, the display panel further includes: a transparent conducting layer on one side, away from the base substrate, of the pixel electrode; wherein the transparent conducting layer includes a plurality of first sub transparent conducting parts disposed at intervals; wherein an orthographic projection of one first sub transparent conducting part on the base substrate is in one first partition; in the same first partition, the orthographic projection of the first sub transparent conducting part on the base substrate covers the orthographic projection of the first through hole on the base substrate, and the orthographic projection of the first sub transparent conducting part on the base substrate is in the orthographic projection of the first pixel electrode on the base substrate; and/or, the transparent conducting layer includes a plurality of second sub transparent conducting parts disposed at intervals; wherein an orthographic projection of one second sub transparent conducting part on the base substrate is in one second partition; and in the same second partition, the orthographic projection of the second sub transparent conducting part on the base substrate covers the orthographic projection of the second through hole on the base substrate, and the orthographic projection of the second sub transparent conducting part on the base substrate is in the orthographic projection of the second pixel electrode on the base substrate.

Optionally, in the embodiment of the present disclosure, the display panel further includes: a first planarization layer between a layer where the reflecting electrode is located and the base substrate; an auxiliary electrode layer between the first planarization layer and the layer where the reflecting electrode is located; and a second planarization layer between the auxiliary electrode layer and the layer where the reflecting electrode is located; wherein the auxiliary electrode layer includes a plurality of first auxiliary electrodes disposed at intervals; wherein an orthographic projection of one first auxiliary electrode on the base substrate is in one first partition; in the same first partition, the orthographic projection of the first pixel electrode on the base substrate covers the orthographic projection of the first auxiliary electrode on the base substrate; and/or, the auxiliary electrode layer includes a plurality of second auxiliary electrodes disposed at intervals; wherein an orthographic projection of one second auxiliary electrode on the base substrate is in one second partition; and in the same second partition, the orthographic projection of the second pixel electrode on the base substrate covers the orthographic projection of the second auxiliary electrode on the base substrate.

Optionally, in the embodiment of the present disclosure, the display panel further includes: a gate insulating layer between the source conducting layer and the base substrate; and the gate conducting layer between the gate insulating layer and the base substrate; wherein the gate conducting layer includes a plurality of first gate lines, a plurality of second gate lines and a plurality of third gate lines; the gate conducting layer further includes: a plurality of first compensating electrodes disposed at intervals; wherein an orthographic projection of one first compensating electrode on the base substrate is in one first partition; in the same first partition, the orthographic projection of the first pixel electrode on the base substrate covers the orthographic projection of the first compensating electrode on the base substrate, and the orthographic projection of the first compensating electrode on the base substrate has an overlapping region with the orthographic projection of the first drain electrode part of the first transistor on the base substrate; and/or, the gate conducting layer further includes: a plurality of second compensating electrodes disposed at intervals; wherein an orthographic projection of one second compensating electrode on the base substrate is in one second partition; and in the same second partition, the orthographic projection of the second pixel electrode on the base substrate covers the orthographic projection of the second compensating electrode on the base substrate, and the orthographic projection of the second compensating electrode on the base substrate has an overlapping region with the orthographic projection of the second drain electrode part of the second transistor on the base substrate.

An embodiment of the present disclosure provides a display device, including the above display panel.

An embodiment of the present disclosure provides a driving method of the above display panel, including: driving sub-pixels in one row group in each data input stage in one frame of time; wherein the driving the sub-pixels in the row group in the data input stage includes: loading a gate electrode turned-on signal on a first gate line electrically connected with sub-pixels of a first sub row group in the row group, loading a gate electrode turned-off signal on a second gate line electrically connected with the sub-pixels of the first sub row group, loading a gate electrode turned-on signal on a third gate line electrically connected with the sub-pixels of the first sub row group, and loading a data signal on each data line, to make a first pixel electrode of the first sub row group be input with the data signal; and loading a gate electrode turned-off signal on a first gate line electrically connected with sub-pixels of a second sub row group in the row group, loading a gate electrode turned-on signal on a second gate line electrically connected with the sub-pixels of the second sub row group, loading a gate electrode turned-on signal on a third gate line electrically connected with the sub-pixels of the second sub row group, and loading a data signal on each data line, to make a second pixel electrode of the second sub row group be input with the data signal.

DETAILED DESCRIPTION OF THE EMBODIMENTS

Figure 1:
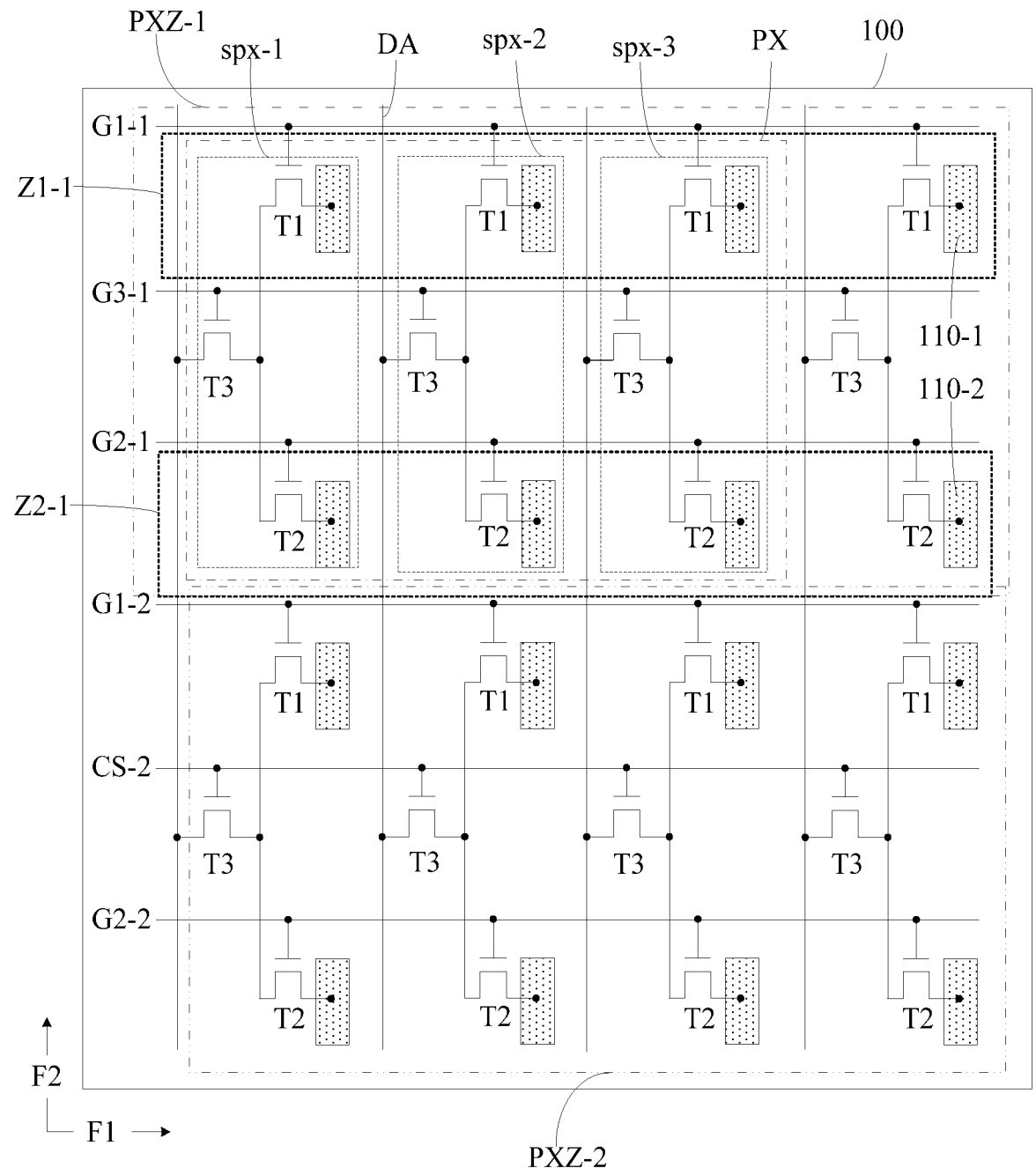
FIG. 1 is a schematic structural diagram of some display panels provided by an embodiment of the present disclosure.
Figure 2:
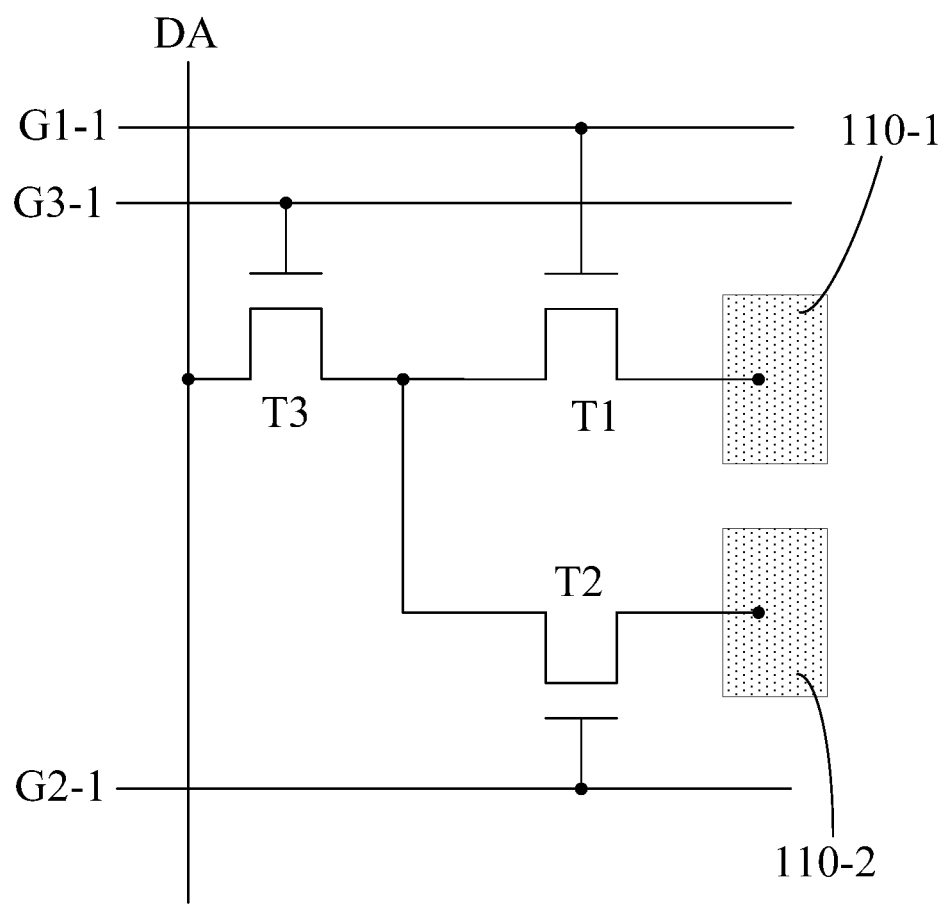
FIG. 2 is a schematic structural diagram of some circuits provided by an embodiment of the present disclosure.

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only configured to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions all the time.

A display region of a general half-transmission half-reflection display panel may be divided into a reflecting region and a transmitting region, and when external environment light is strong, external environment light rays provide a light source for the half-transmission half-reflection display panel by means of reflecting of the reflecting region so as to make the display panel display images. Under an environment without external light or with weak light, a backlight source in the half-transmission half-reflection display panel works, and emitted light rays of the backlight source penetrate through the transmitting region to provide a light source for the half-transmission half-reflection display panel to make the display panel display images.

An embodiment of the present disclosure provides a display panel. As shown in FIG. 1 to FIG. 6C, the display panel may include: a base substrate 100, a plurality of sub-pixels disposed on the base substrate 100, a plurality of transistors, a plurality of data lines DA disposed on the base substrate 100 at intervals, and a plurality of gate lines disposed on the base substrate 100 at intervals. At least one of the plurality of sub-pixels may include a pixel electrode.

Two adjacent rows of sub-pixels are taken as a row group PXZ-n (1≤n≤N, n and N are integers, and N is a total quantity of the row groups. N=2 is taken as an example in FIG. 1 and FIG. 2), and the row group PXZ-n has a first sub row group Z1-n and a second sub row group Z2-n arranged in a column direction F2. For example, 4 rows of sub-pixels in FIG. 1 are taken as an example, and the first row of sub-pixels and the second row of sub-pixels are the first row group PXZ-1, so the first row of sub-pixels serves as the first sub row group Z1-1 in the first row group PXZ-1, and the second row of sub-pixels serves as the second sub row group Z2-1 in the first row group PXZ-1. The third row of sub-pixels and the fourth row of sub-pixels are the second row group PXZ-2, so the third row of sub-pixels serves as the first sub row group Z1-2 in the second row group PXZ-2, and the fourth row of sub-pixels serves as the second sub row group Z2-2 in the second row group PXZ-2.

The plurality of transistors may include a plurality of first transistors T1, a plurality of second transistors T2 and a plurality of third transistors T3. The plurality of gate lines may include a plurality of first gate lines G1-n, a plurality of second gate lines G2-n and a plurality of third gate lines G3-n. The pixel electrode may include a first pixel electrode 110-1 and a second pixel electrode 110-2. One sub-pixel in the first sub row group Z1-n may include one first transistor T1 and one first pixel electrode 110-1. A gate electrode of the first transistor T1 in the first sub row group Z1-n is electrically connected with one first gate line G1-n. In the same sub-pixel, a second electrode of the first transistor T1 is electrically connected with the first pixel electrode 110-1. One sub-pixel in the second sub row group Z2-n may include one second transistor T2 and one second pixel electrode 110-2. A gate electrode of the second transistor T2 in the second sub row group Z2-n is electrically connected with one second gate line G2-n. In the same sub-pixel, a second electrode of the second transistor T2 is electrically connected with the second pixel electrode 110-2. In the same row group PXZ-n, two adjacent sub-pixels in the column direction F2 share one third transistor T3. A gate electrode of the third transistor T3 in the row group PXZ-n is electrically connected to one third gate line G3-n. The first transistor T1 and the second transistor T2 in one column of sub-pixels are electrically connected with one data line DA through the shared third transistor T3.

In the display panel provided by the embodiment of the present disclosure, by disposing the third transistors, when the first transistors and the third transistors are both turned on, data signals transmitted on the data lines may be provided to the first pixel electrodes. In this way, the first transistors and the third transistors may be combined into a double-gate thin film transistor (TFT). Therefore, the first transistors and the third transistors may be made to jointly control signal circulation between the data lines and the first pixel electrodes, thereby increasing ON-state currents of the transistors, lowering OFF-state currents of the transistors, lowering power consumption, and improving stability.

When the second transistors and the third transistors are both turned on, the data signals transmitted on the data lines may be provided to the second pixel electrodes. In this way, the second transistors and the third transistors may be combined into a double-gate TFT. Therefore, the second transistors and the third transistors may be made to jointly control signal circulation between the data lines and the second pixel electrodes, thereby increasing ON-state currents of the transistors, lowering OFF-state currents of the transistors, lowering power consumption, and improving stability.

It needs to be noted that when a gate electrode turned-on signal is loaded on the first gate lines G1-n, the first transistors T1 may be controlled to be turned on. When a gate electrode turned-off signal is loaded on the first gate lines G1-n, the first transistors T1 may be controlled to be turned off. When the first transistors T1 are N-type transistors, the gate electrode turned-on signal may be a high-level signal, and the gate electrode turned-off signal may be a low-level signal. When the first transistors T1 are P-type transistors, the gate electrode turned-on signal may be a low-level signal, and the gate electrode turned-off signal may be a high-level signal.

It needs to be noted that when a gate electrode turned-on signal is loaded on the second gate lines G2-n, the second transistors T2 may be controlled to be turned on. When a gate electrode turned-off signal is loaded on the second gate lines G2-n, the second transistors T2 may be controlled to be turned off. When the second transistors T2 are N-type transistors, the gate electrode turned-on signal may be a high-level signal, and the gate electrode turned-off signal may be a low-level signal. When the second transistors T2 are P-type transistors, the gate electrode turned-on signal may be a low-level signal, and the gate electrode turned-off signal may be a high-level signal.

It needs to be noted that when a gate electrode turned-on signal is loaded on the third gate lines G3-n, the third transistors T3 may be controlled to be turned on. When a gate electrode turned-off signal is loaded on the third gate lines G3-n, the third transistors T3 may be controlled to be turned off. When the third transistors T3 are N-type transistors, the gate electrode turned-on signal may be a high-level signal, and the gate electrode turned-off signal may be a low-level signal. When the third transistors T3 are P-type transistors, the gate electrode turned-on signal may be a low-level signal, and the gate electrode turned-off signal may be a high-level signal.

During specific implementation, in the embodiment of the present disclosure, as shown in FIG. 1, in the same row group PXZ-n, two adjacent sub-pixels in the column direction F2 may constitute one sub-pixel group. For example, in the first row group PXZ-1, the two sub-pixels sharing the same third transistor T3 may serve as one sub-pixel group. The sub-pixel group may be configured to be at least a part of a region of one pixel point in a display image. For example, the sub-pixel group may be configured to be one pixel point in the display image. Or, the sub-pixel group may also be configured to be a part of a region of one pixel point in the display image. Of course, in practical applications, specific implementations of the sub-pixel group may be designed and determined according to the requirements of the practical application environment, which is not limited here.

During specific implementation, in the embodiment of the present disclosure, as shown in FIG. 1, the display panel may include a plurality of pixel units PX. Exemplarily, each pixel unit PX may include a plurality of sub-pixel groups, and the sub-pixel groups are distributed in an array. For example, the pixel unit PX may include a first-color sub-pixel group spx-1, a second-color sub-pixel group spx-2 and a third-color sub-pixel group spx-3 arranged in sequence in a row direction F1. Exemplarily, a first color, a second color and a third color may be randomly selected from red, green and blue. For example, the first color may be set as red, the second color may be set as green, and the third color may be set as blue, so that the first-color sub-pixel group spx-1 has two red sub-pixels, the second-color sub-pixel group spx-2 has two green sub-pixels, and the third-color sub-pixel group spx-3 has two blue sub-pixels. In this way, red, green and blue may be mixed to form one pixel point in the display image to make the display panel achieve a display effect. In this way, the pixel unit in the embodiment of the present disclosure serves as one pixel point in the display image, and the sub-pixel group may serve as a part of a region of one pixel point in the display image. Of course, in practical applications, specific implementations of the pixel unit may be designed according to the practical application environment, which is not limited here. In the following, illustration is made by taking an example that the pixel unit includes a red sub-pixel group, a green sub-pixel group and a blue sub-pixel group arranged in sequence in the row direction F1.

Figure 4A:
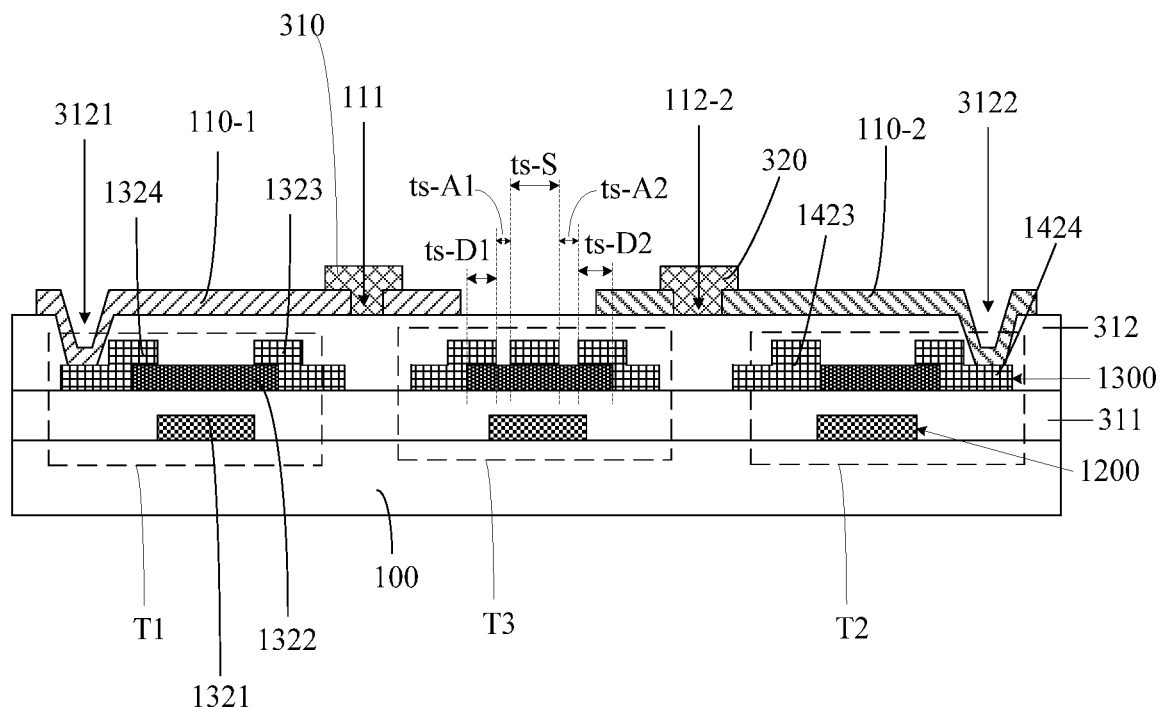
FIG. 4A is a schematic cross-sectional diagram in a direction AA' in the schematic diagram shown in FIG. 3.

During specific implementation, in the embodiment of the present disclosure, in combination with FIG. 4A, the display panel may further include: a first planarization layer 312, located between a layer where a reflecting electrode is located and the base substrate 100; a source conducting layer 1300, located between the first planarization layer 312 and the base substrate 100, where the source conducting layer 1300 may include a plurality of data lines DA disposed at intervals; a gate insulating layer 311, located between the source conducting layer 1300 and the base substrate 100; and a gate conducting layer 1200, located between the gate insulating layer 311 and the base substrate 100. The gate conducting layer 1200 may include a plurality of first gate lines G1-n, a plurality of second gate lines G2-n and a plurality of third gate lines G3-n disposed at intervals. The sub-pixels in one row of first sub row group Z1-n are electrically connected with one first gate line G1-n, the sub-pixels in one row of second sub row group Z2-n are electrically connected with one second gate line G2-n, and one column of sub-pixels is electrically connected with one data line DA.

Exemplarily, as shown in FIG. 4A, a semiconductor layer is further disposed between the gate insulating layer 311 and the source conducting layer 1300. The semiconductor layer may include an active layer forming each transistor. The active layer has a channel region. The gate conducting layer 1200 may further include a gate electrode forming each transistor. Exemplarily, in combination with FIG. 4A, taking an example that a first electrode of the first transistor T1 is a first source electrode part and a second electrode thereof is a first drain electrode part, the first transistor T1 may include: a gate electrode 1321, an active layer 1322 insulated from the gate electrode 1321, a first source electrode part 1323 and a first drain electrode part 1324 insulated from the gate electrode 1321 and electrically connected with the active layer 1322, a first pixel electrode 110-1 and a second pixel electrode 110-2. The gate electrode 1321 is located between the active layer 1322 and the base substrate 100. A layer where the first source electrode part 1323 and the first drain electrode part 1324 are located is located on one side of the active layer 1322 away from the base substrate 100. The gate insulating layer 311 is disposed between the gate electrode 1321 and the active layer 1322. The first source electrode part 1323 and the first drain electrode part 1324 are in direct lap joint with the active layer 1322. The first planarization layer 312 is disposed between the layer where the first source electrode part 1323 and the first drain electrode part 1324 are located and a layer where the first pixel electrode 110-1 and the second pixel electrode 110-2 are located. The first pixel electrode 110-1 is electrically connected with the first drain electrode part 1324 through a via hole 3121 penetrating through the first planarization layer 312. The structures of the second transistor T2 and the third transistor T3 are substantially the same as the structure of the first transistor T1, the second pixel electrode 110-2 is electrically connected with the second electrode of the second transistor T2 through a via hole 3122 penetrating through the first planarization layer 312, and remaining structures are omitted here.

Figure 3:
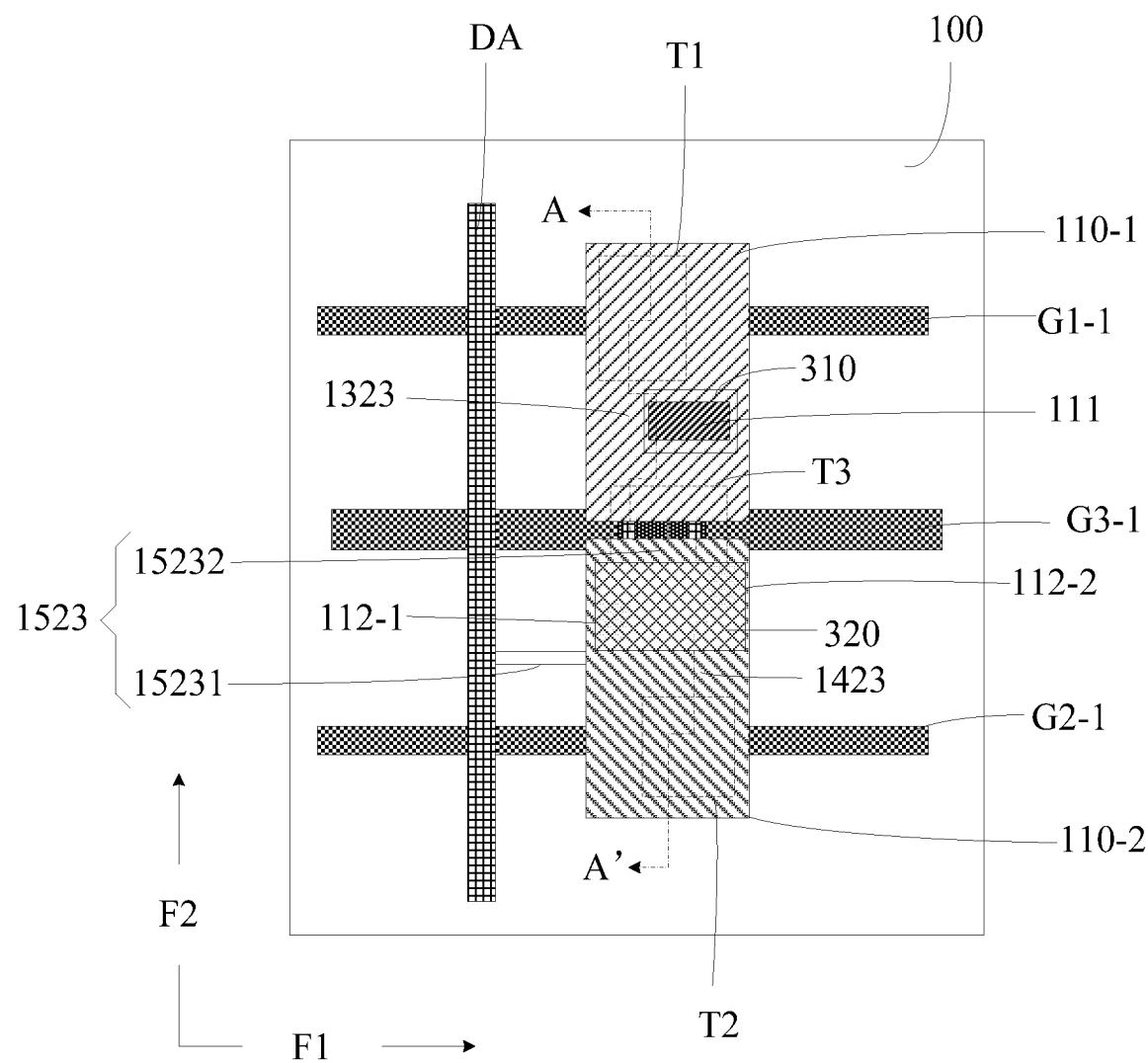
FIG. 3 is a schematic diagram of some layout structures provided by an embodiment of the present disclosure.

During specific implementation, in combination with FIG. 3 and FIG. 4A, the active layer of the third transistor T3 includes a first source electrode region ts-S, a first drain electrode region ts-D1, a second drain electrode region ts-D2, a first channel region ts-A1 and a second channel region ts-A2. The first channel region ts-A1 is located between the first source electrode region ts-S and the first drain electrode region ts-D1, and the second channel region ts-A2 is located between the first source electrode region ts-S and the second drain electrode region ts-D2. The first source electrode region ts-S is electrically connected with the corresponding data line DA, the first drain electrode region ts-D1 is electrically connected with the first electrode of the first transistor T1, and the second drain electrode region ts-D2 is electrically connected with the first electrode of the second transistor T2.

Exemplarily, as shown in FIG. 3 and FIG. 4A, the source conducting layer 1300 may further include: a plurality of source connecting parts 1523, a plurality of first source electrode parts 1323, a plurality of second source electrode parts 1423, a plurality of first drain electrode parts 1324 and a plurality of second drain electrode parts 1424. One source connecting part 1523, one first source electrode part 1323, one first drain electrode part 1324, one second source electrode part and one second drain electrode part 1424 are located in one sub-pixel group. One first source electrode part 1323 serves as the first electrode of one first transistor T1, and one first drain electrode part 1324 serves as the second electrode of the first transistor T1. One second source electrode part 1423 serves as the first electrode of one second transistor T2, and one second drain electrode part 1424 serves as the second electrode of the second transistor T2. In the same sub-pixel group, the first source electrode part 1323 is electrically connected with the first drain electrode region ts-D1, the second source electrode part 1423 is electrically connected with the second drain electrode region ts-D2, the first source electrode region ts-S is electrically connected with the source connecting part 1523, and the source connecting part 1523 is electrically connected with one data line DA. Of course, the present disclosure is not limited to this.

Exemplarily, in combination with FIG. 3, the source connecting part 1523 may include: a first sub source connecting part 15231 and a second sub source connecting part 15232 electrically connected with each other. The first sub source connecting part 15231 extends in the row direction F1, and the second sub source connecting part 15232 extends in the column direction F2. The first sub source connecting part 15231 is electrically connected with the data line DA, and the second sub source connecting part 15232 is electrically connected with the first source electrode region ts-S, that is, the second sub source connecting part 15232 is electrically connected with the third transistor T3. Therefore, the source connecting part 1523 may be set in a zigzag shape. Of course, the present disclosure is not limited to this.

Figure 5:
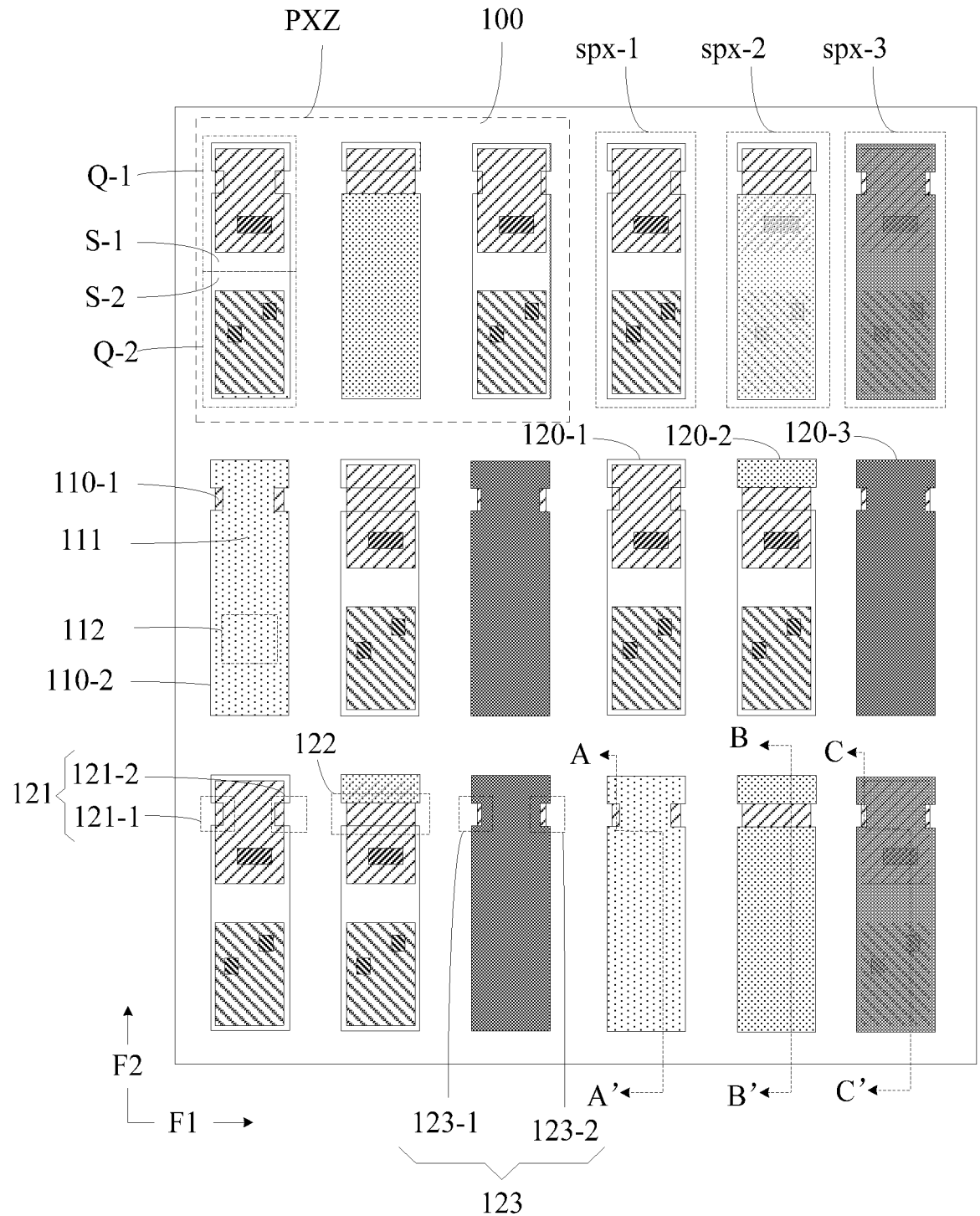
FIG. 5 is a schematic structural diagram of some other display panels provided by an embodiment of the present disclosure.

Exemplarily, the pixel electrode may be set as a reflecting electrode. As shown in FIG. 5 to FIG. 6C, the first pixel electrode 110-1 is provided with a first through hole 111, the second pixel electrode 110-2 is provided with a second through hole 112, and an area of the first through hole 111 is different from an area of the second through hole 112. It needs to be noted that the through holes may be configured to transmit backlight, and the reflecting electrode may be configured to reflect light incident to the reflecting electrode. Of course, the through holes and the reflecting electrode may further achieve functions in other display panels, which is not limited here.

In the display panel provided by the embodiment of the present disclosure, the penetrating first through hole is formed in the first reflecting electrode, and the penetrating second through hole is formed in the second reflecting electrode. When external environment light is strong, the display panel may be in a reflecting mode to make the external environment light provide a light source for the display panel through reflecting by the reflecting electrodes, so as to make the display panel display images, and at the moment, a backlight source may be turned off to lower power consumption. Under an environment without external light or with weak light, the display panel may be in a transmission mode, the backlight source works, and emitted light rays of the backlight source penetrate through the first through hole and the second through hole to provide a light source for the display panel so as to make the display panel display images. Therefore, the display panel provided by the embodiment of the present disclosure may implement a half-transmission half-reflection display panel.

Exemplarily, during specific implementation, in the embodiment of the present disclosure, as shown in FIG. 5 to FIG. 6C, the base substrate may have a first partition Q-1 and a second partition Q-2. The first partition covers one sub-pixel in the sub-pixel group, and the second partition covers another sub-pixel in the sub-pixel group. For example, orthographic projections of one first pixel electrode 110-1 and one first transistor T1 on the base substrate 100 are in one first partition Q-1. Orthographic projections of one second pixel electrode 110-2 and one second transistor T2 on the base substrate 100 are in one second partition Q-2. The display panel may further include: an opposite substrate 200 disposed opposite to the base substrate 100, and a color resistance layer between the base substrate 100 and the opposite substrate 200. The color resistance layer may include: sub color resistance layers in the sub-pixels. Each sub color resistance layer may have a first sub color resistance region S-1 and a second sub color resistance region S-2. In a direction perpendicular to a plane where the base substrate 100 is located, the first partition Q-1 covers the first sub color resistance regions S-1, and the second partition Q-2 covers the second sub color resistance regions S-2. In this way, one sub-pixel may achieve multi-gray-scale display so as to improve the display effect.

During specific implementation, in the embodiment of the present disclosure, as shown in FIG. 5 to FIG. 6C, the display panel may further include a liquid crystal layer 300 packaged between the base substrate 100 and the opposite substrate 200. A common electrode is disposed on the opposite substrate 200, and thin film transistors (TFT) in the partitions are further disposed on the base substrate 100. The display panel may further include a plurality of gate lines and a plurality of data lines DA, gate electrodes of the TFTs in the same partition of one row of sub-pixels may be electrically connected with one gate line, source electrodes of the TFTs in one column of sub-pixels may be electrically connected with one data line DA, and drain electrodes of the TFTs may be electrically connected with the reflecting electrodes. Exemplarily, when a signal transmitted on the gate electrodes controls the TFTs to be turned on, a data signal transmitted on the data line DA may be input to the reflecting electrode to make the reflecting electrode be input with a voltage of the data signal for displaying. A corresponding voltage is further applied to the common electrode, so that an electric field exists between the reflecting electrode and the common electrode to control liquid crystal molecules to deflect, and the display effect is achieved in combination with a light source.

During specific implementation, in the embodiment of the present disclosure, as shown in FIG. 5 to FIG. 6C, the first pixel electrode 110-1 may have a first facing area with the sub color resistance layer in the first sub color resistance region S-1, and the second pixel electrode 110-2 may have a second facing area with the sub color resistance layer in the second sub color resistance region S-2. In the same sub-pixel group, the first facing area and the second facing area are different. In this way, in the same sub-pixel group, light emitting brightness of a region where the first facing area is located is different from light emitting brightness of a region where the second facing area is located, so that the sub-pixel group may achieve brightness of different gray scales. It needs to be noted that an orthographic projection of the first pixel electrode 110-1 on the base substrate 100 and an orthographic projection of the sub color resistance layer located in the first sub color resistance region S-1 may have a first overlapping region, and an area of the first overlapping region may serve as the first facing area. An orthographic projection of the second pixel electrode 110-2 on the base substrate 100 and an orthographic projection of the sub color resistance layer in the second sub color resistance region S-2 may have a second overlapping region, and an area of the second overlapping region may serve as the second facing area.

Exemplarily, during specific implementation, in the embodiment of the present disclosure, as shown in FIG. 5 to FIG. 6C, in the same sub-pixel group, an area of the first pixel electrode 110-1 and an area of the second pixel electrode 110-2 may be substantially the same, and an area of the first sub color resistance region S-1 is smaller than an area of the second sub color resistance region S-2. In this way, when the display panel is in the reflecting mode, since the area of the first sub color resistance region S-1 and the area of the second sub color resistance region S-2 are different, the brightness of the first partition Q-1 and the brightness of the second partition Q-2 may be different, and the sub-pixel group of the same color may achieve brightness of 4 gray scales. When the display panel is in the transmission mode, since the area of the first sub color resistance region S-1 and the area of the second sub color resistance region S-2 are different, the brightness of the first partition Q-1 and the brightness of the second partition Q-2 may be different, and the sub-pixel group of the same color may achieve brightness of 4 gray scales.

Exemplarily, the red sub-pixel is taken as an example for illustration. When the display panel is in the reflecting mode, the backlight source is turned off, and the reflecting electrode reflects external environment light to make the display panel perform displaying. If within one frame of display time, in one red sub-pixel group, the first partition Q-1 and the second partition Q-2 do not emit light either, red is used as the first gray scale H1. If within one frame of display time, in one red sub-pixel group, only the first partition Q-1 emits light, red is used as the second gray scale H2. If within one frame of display time, in one red sub-pixel group, only the second partition Q-2 emits light, red is used as the third gray scale H3. If within one frame of display time, in one red sub-pixel group, both the first partition Q-1 and the second partition Q-2 emit light, red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

During specific implementation, in the embodiment of the present disclosure, as shown in FIG. 5 to FIG. 6C and FIG. 7, the sub color resistance layer in the first partition Q-1 may be provided with a first via hole, the first via hole penetrates through the sub color resistance layer, and the sub color resistance layer in the second partition Q-2 is not provided with a first via hole. An orthographic projection of the first via hole on the base substrate 100 does not overlap with an orthographic projection of the first through hole 111 on the base substrate 100. Exemplarily, in the same sub-pixel, a sum of an area of the sub color resistance layer and an area of the first via hole in the first partition Q-1 may be the same as an area of the sub color resistance layer in the second partition Q-2. In this way, by disposing the first via hole, an area occupied by the sub color resistance layer in the first partition Q-1 may be smaller than an area occupied by the sub color resistance layer in the second partition Q-2.

Figure 8:
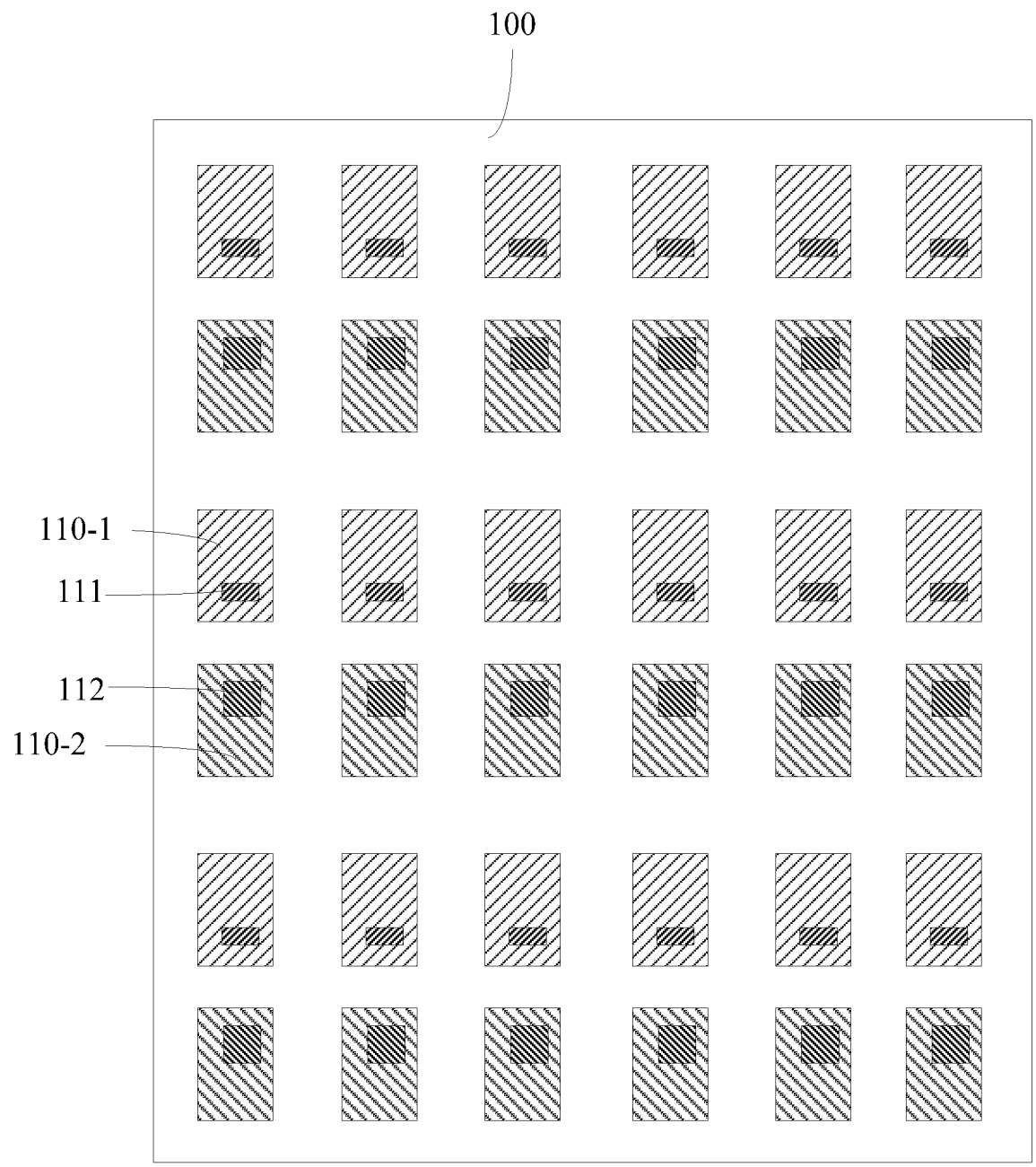
FIG. 8 is a schematic structural diagram of some other pixel electrodes provided by an embodiment of the present disclosure.

During specific implementation, in the embodiment of the present disclosure, in the same sub-pixel group, an area of the first through hole and an area of the second through hole may be different. Exemplarily, as shown in FIG. 5 and FIG. 8, in the same sub-pixel group, an area of the second through hole 112 may be set to be N times an area of the first through hole 111. It may be that 1<N≤5. Exemplarily, it may be that 2≤N≤3. For example, it may be that N=2, in the same sub-pixel group, the area of the second through hole 112 may be set to be 2 times the area of the first through hole 111, and in this way, light intensity of transmission light of the second partition Q-2 may be 2 times light intensity of transmission light of the first partition Q-1. It may also be that N=3, in the same sub-pixel group, the area of the second through hole 112 may be set to be 3 times the area of the first through hole 111, and in this way, light intensity of transmission light of the second partition Q-2 may be 3 times light intensity of transmission light of the first partition Q-1. Exemplarily, in each sub-pixel group, the area of the first through hole 111 may be substantially the same. In each sub-pixel group, the area of the second through hole 112 may be substantially the same. It needs to be noted that in practical applications, the area of the second through hole 112, the area of the first through hole 111 and a value of N may be designed and determined according to the practical application environment, which is not limited here.

Exemplarily, N=2 is taken as an example, and in the same sub-pixel group, the area of the second through hole 112 is set to be 2 times the area of the first through hole 111. During actual preparation, the region where the sub-pixel group is located may be substantially in mirror symmetry according to a central axis extending in the row direction F1, and in order to make the area of the first pixel electrode 110-1 and the area of the second pixel electrode 110-2 be the same in the same sub-pixel group, a width of the first pixel electrode 110-1 in the row direction F1 may be made be substantially the same as a width of the second pixel electrode 110-2 in the row direction F1, and a width of the second pixel electrode 110-2 in the column direction F2 may be made greater than a width of the first pixel electrode 110-1 in the column direction F2. A center of a region constituted by the first pixel electrode 110-1 and the first through hole 111 is used as a first center, a center of a region constituted by the second pixel electrode 110-2 and the second through hole 112 is used as a second center, and the first center is closer to the central axis relative to the second center, so that in the same sub-pixel group, the area of the first pixel electrode 110-1 and the area of the second pixel electrode 110-2 may be made the same.

Figure 9:
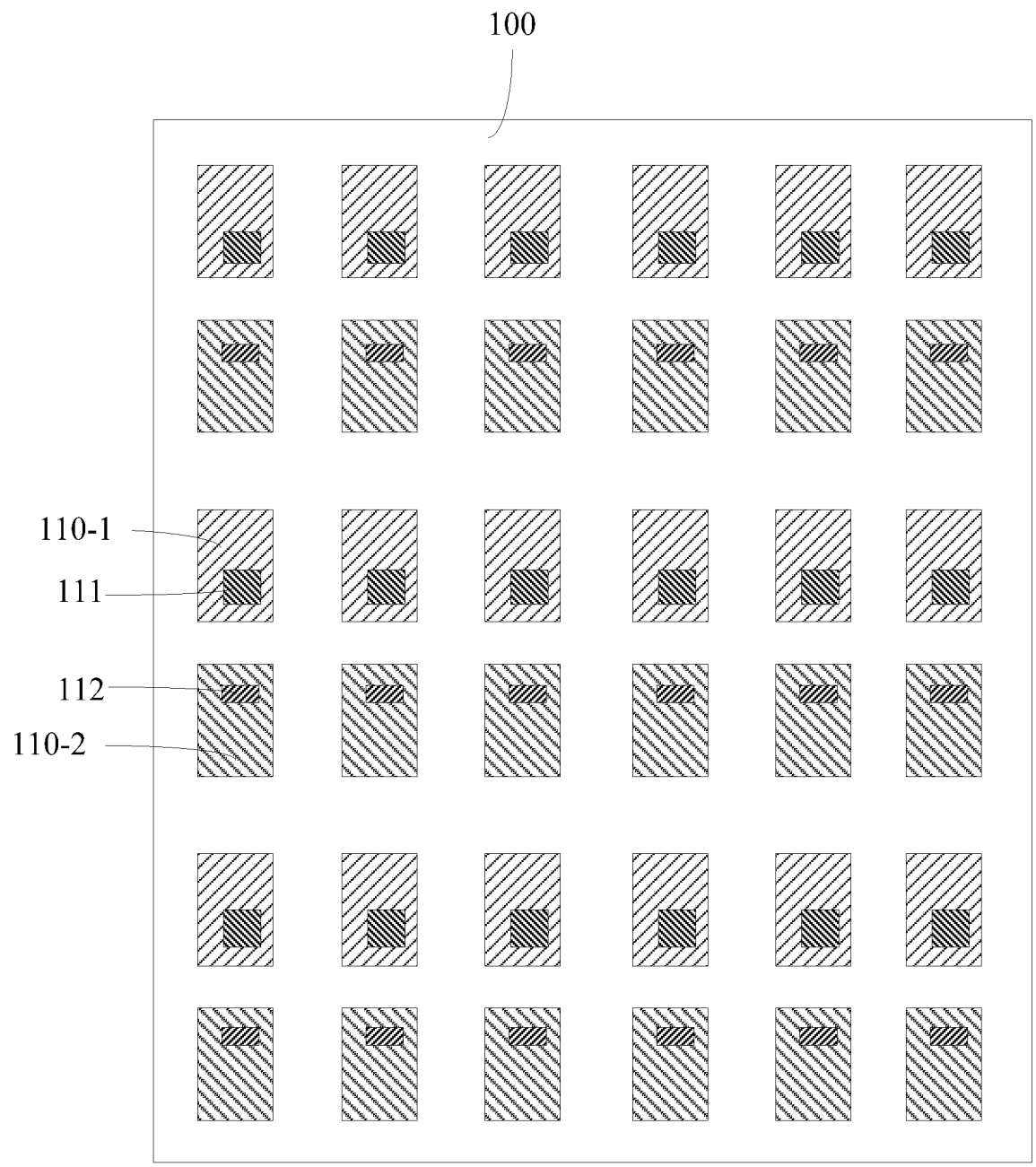
FIG. 9 is a schematic structural diagram of further some pixel electrodes provided by an embodiment of the present disclosure.

During specific implementation, in the embodiment of the present disclosure, as shown in FIG. 9, in the same sub-pixel group, the area of the first through hole 111 may also be set to be X times the area of the second through hole 112, where it may be that 1<X≤5. Exemplarily, it may be that 2≤X≤3. For example, it may be that X=2, in the same sub-pixel group, the area of the first through hole 111 may also be set to be 2 times the area of the second through hole 112, and in this way, light intensity of transmission light of the first partition Q-1 may be 2 times light intensity of transmission light of the second partition Q-2. Or, it may be that X=3, in the same sub-pixel group, the area of the first through hole 111 may also be set to be 3 times the area of the second through hole 112, and in this way, light intensity of transmission light of the first partition Q-1 may be 3 times light intensity of transmission light of the second partition Q-2. Exemplarily, in each sub-pixel group, the area of the first through hole 111 may be substantially the same. In each sub-pixel group, the area of the second through hole 112 may be substantially the same. It needs to be noted that in practical applications, the area of the second through hole 112, the area of the first through hole 111 and a value of X may be designed and determined according to the practical application environment, which is not limited here.

Exemplarily, X=2 is taken as an example, and in the same sub-pixel group, the area of the first through hole 111 is set to be 2 times the area of the second through hole 112. During actual preparation, the region where the sub-pixel group is located may be substantially in mirror symmetry according to a central axis extending in the row direction F1, and in order to make the area of the first pixel electrode 110-1 and the area of the second pixel electrode 110-2 be the same in the same sub-pixel group, the width of the first pixel electrode 110-1 in the row direction F1 may be made be substantially the same as the width of the second pixel electrode 110-2 in the row direction F1, and the width of the first pixel electrode 110-1 in the column direction F2 may be made greater than the width of the second pixel electrode 110-2 in the column direction F2. The center of the region constituted by the first pixel electrode 110-1 and the first through hole 111 is used as the first center, the center of the region constituted by the second pixel electrode 110-2 and the second through hole 112 is used as the second center, and the second center is closer to the central axis relative to the first center, so that in the same sub-pixel group, the area of the first pixel electrode 110-1 and the area of the second pixel electrode 110-2 may be made the same.

Exemplarily, the red sub-pixel is taken as an example for illustration. When the display panel is in the transmission mode, the backlight source works, and light emitted by the backlight source is transmitted through the through holes to make the display panel perform displaying. If within one frame of display time, in one red sub-pixel group, the first partition Q-1 and the second partition Q-2 do not emit light either, red is used as the first gray scale H1. If within one frame of display time, in one red sub-pixel group, only the first partition Q-1 emits light, red is used as the second gray scale H2. If within one frame of display time, in one red sub-pixel group, only the second partition Q-2 emits light, red is used as the third gray scale H3. If within one frame of display time, in one red sub-pixel group, both the first partition Q-1 and the second partition Q-2 emit light, red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

Since the first through hole region is not provided with the first pixel electrode, during specific implementation, as shown in FIG. 3 and FIG. 4A, a transparent conducting layer may be disposed on one side of the reflecting electrode away from the base substrate. The transparent conducting layer may include a plurality of first sub transparent conducting parts 310 disposed at intervals. An orthographic projection of one first sub transparent conducting part 310 on the base substrate 100 may be in one first partition Q-1, that is, one first partition Q-1 is provided with one first sub transparent conducting part 310. One first through hole 111 corresponds to one first sub transparent conducting part 310, and in the same first partition Q-1, the orthographic projection of the first sub transparent conducting part 310 on the base substrate 100 covers the orthographic projection of the first through hole 111 on the base substrate 100. The orthographic projection of the first sub transparent conducting part 310 on the base substrate 100 is in the orthographic projection of the first pixel electrode 110-1 on the base substrate 100. Further, the first sub transparent conducting part 310 is electrically connected with the first pixel electrode 110-1 directly. For example, the transparent conducting layer is directly prepared on the reflecting electrode. In this way, the first sub transparent conducting part may shield the first through hole, and an electric field may also exist in the first through hole region, so that the display effect is improved.

Since the second through hole region is not provided with the second pixel electrode, during specific implementation, as shown in FIG. 3 and FIG. 4A, the transparent conducting layer may be disposed on one side of the reflecting electrode away from the base substrate. The transparent conducting layer includes a plurality of second sub transparent conducting parts 320 disposed at intervals. An orthographic projection of one second sub transparent conducting part 320 on the base substrate 100 is in one second partition Q-2. That is, one second partition Q-2 is provided with one second sub transparent conducting part 320. One second through hole 112 corresponds to one second sub transparent conducting part 320, and in the same second partition Q-2, the orthographic projection of the second sub transparent conducting part 320 on the base substrate 100 covers the orthographic projection of the second through hole 112 on the base substrate 100. The orthographic projection of the second sub transparent conducting part 320 on the base substrate 100 is in the orthographic projection of the second pixel electrode 110-2 on the base substrate 100. Further, the second sub transparent conducting part 320 is electrically connected with the second pixel electrode 110-2 directly. For example, the transparent conducting layer is directly prepared on the reflecting electrode. In this way, the second sub transparent conducting part 320 may shield the second through hole 112, and an electric field may also exist in the second through hole region, so that the display effect is improved.

Figure 4B:
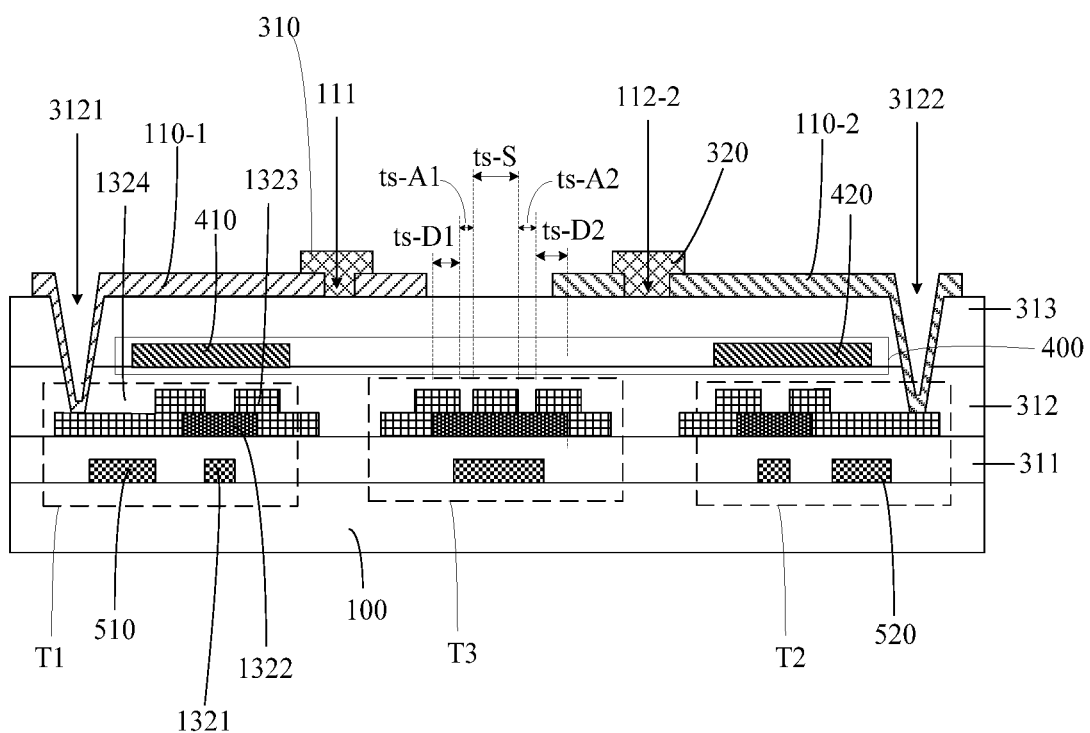
FIG. 4B is another schematic cross-sectional diagram in the direction AA' in the schematic diagram shown in FIG. 3.

During specific implementation, in order to increase capacitance values of the first pixel electrode and the second pixel electrode, as shown in FIG. 4B, an auxiliary electrode layer 400 may be disposed between the layer where the reflecting electrode is located and the first planarization layer 312, and a second planarization layer 313 may be disposed between the auxiliary electrode layer 400 and the layer where the reflecting electrode is located. The first pixel electrode 110-1 is electrically connected with the first drain electrode part 1324 through a via hole 3121 penetrating through the first planarization layer 312 and the second planarization layer 313. The second pixel electrode 110-2 is electrically connected with the second electrode of the second transistor T2 through a via hole 3122 penetrating through the first planarization layer 312 and the second planarization layer 313, and remaining structures are omitted here.

Exemplarily, as shown in FIG. 4B, the auxiliary electrode layer 400 may include a plurality of first auxiliary electrodes 410 disposed at intervals. An orthographic projection of one first auxiliary electrode 410 on the base substrate 100 is in one first partition Q-1, that is, the first partition Q-1 is provided with one first auxiliary electrode 410, and one first pixel electrode 110-1 corresponds to one first auxiliary electrode 410. In the same first partition Q-1, the orthographic projection of the first pixel electrode 110-1 on the base substrate 100 covers the orthographic projection of the first auxiliary electrode 410 on the base substrate 100. In this way, a facing area may exist between the first pixel electrode 110-1 and the first auxiliary electrode 410 to form a capacitance structure C11.

Exemplarily, as shown in FIG. 4B, the auxiliary electrode layer 400 may include a plurality of second auxiliary electrodes 420 disposed at intervals. An orthographic projection of one second auxiliary electrode 420 on the base substrate 100 is in one second partition Q-2, that is, one second partition Q-2 is provided with one second auxiliary electrode 420, and one first pixel electrode 110-1 corresponds to one first auxiliary electrode 410. In the same second partition Q-2, the orthographic projection of the second pixel electrode 110-2 on the base substrate 100 covers the orthographic projection of the second auxiliary electrode 420 on the base substrate 100. In this way, a facing area may exist between the second pixel electrode 110-2 and the second auxiliary electrode 420 to form a capacitance structure C12.

Further, in order to increase the capacitance values of the first pixel electrode and the second pixel electrode, as shown in FIG. 4B, the gate conducting layer may further include: a plurality of first compensating electrodes 510 disposed at intervals. That is, the plurality of first compensating electrodes 510 which are spaced from each other may be disposed in a layer where the gate electrode 1321 is located. An orthographic projection of one first compensating electrode 510 on the base substrate 100 is in one first partition Q-1, that is, one first pixel electrode 110-1 corresponds to one first compensating electrode 510. In the same first partition Q-1, the orthographic projection of the first pixel electrode 110-1 on the base substrate 100 covers the orthographic projection of the first compensating electrode 510 on the base substrate 100, and the orthographic projection of the first compensating electrode 510 on the base substrate 100 has an overlapping region with the orthographic projection of the first drain electrode part 1324 of the first transistor T1 on the base substrate 100. In this way, a facing area may exist between the first compensating electrode 510 and the first drain electrode part 1324 of the first transistor T1 to form a capacitance structure C21.

Exemplarily, as shown in FIG. 4B, the gate conducting layer 1200 may further include: a plurality of second compensating electrodes 520 disposed at intervals. An orthographic projection of one second compensating electrode 520 on the base substrate 100 is in one second partition Q-2. That is, one second pixel electrode 110-2 corresponds to one second auxiliary electrode 420. In the same second partition Q-2, the orthographic projection of the second pixel electrode 110-2 on the base substrate 100 covers the orthographic projection of the second compensating electrode 520 on the base substrate 100, and the orthographic projection of the second compensating electrode 520 on the base substrate 100 has an overlapping region with the orthographic projection of the second drain electrode part 1424 of the second transistor T2 on the base substrate 100. In this way, a facing area may exist between the second compensating electrode 520 and the second drain electrode part 1424 of the second transistor T2 to form a capacitance structure C22.

To sum up, the capacitance structures C11 and C21 may form a parallel relationship to increase the capacitance value of the first pixel electrode. The capacitance structures C12 and C22 may form a parallel relationship to increase the capacitance value of the second pixel electrode. It needs to be noted that a sum of the capacitance values of the first pixel electrodes may be made substantially the same as a sum of the capacitance values of the second pixel electrodes. For example, the capacitance value of the capacitance structure C11 may be made substantially the same as the capacitance value of the capacitance structure C21, and the capacitance value of the capacitance structure C12 may be made substantially the same as the capacitance value of the capacitance structure C22. Of course, in practical applications, specific structure forms of the capacitance structures C11, C12, C21 and C22 may be designed and determined according to the practical application environment, which is not limited here.

Generally, the source conducting layer and the gate conducting layer are prepared from a metal material. A metal material is generally opaque, and thus, in order to prevent the source conducting layer and the gate conducting layer from shielding the first through hole, during specific implementation, in the embodiment of the present disclosure, in combination with FIG. 3 to FIG. 4B, the orthographic projection of the first through hole 111 on the base substrate 100 may not overlap with orthographic projections of the source conducting layer and the gate conducting layer on the base substrate. In this way, the source conducting layer and the gate conducting layer may be prevented from shielding light of the first through hole.

During specific implementation, in the embodiment of the present disclosure, in combination with FIG. 3 to FIG. 4B, the orthographic projection of the second through hole 112 on the base substrate 100 may not overlap with the orthographic projections of the source conducting layer and the gate conducting layer on the base substrate. In this way, the source conducting layer and the gate conducting layer may be prevented from shielding light of the second through hole.

During specific implementation, in the embodiment of the present disclosure, in combination with FIG. 3, for the first gate line G1 and the first pixel electrode 110-1 electrically connected with the first transistor T1, orthographic projections of the first gate line G1 and the first transistor T1 on the base substrate 100 have overlapping regions with the orthographic projection of the first pixel electrode 110-1 on the base substrate 100. For example, the orthographic projection of the first pixel electrode 110-1 on the base substrate 100 covers the orthographic projection of the first transistor T1 on the base substrate 100, and the orthographic projection of the first pixel electrode 110-1 on the base substrate 100 has an overlapping region with the orthographic projection of the first gate line G1 on the base substrate 100. Since a film layer where the first gate line G1 and the first transistor T1 are located is between the first pixel electrode 110-1 and the base substrate 100, and the orthographic projection of the first gate line G1 on the base substrate 100 has an overlapping region with the orthographic projections of the first pixel electrode 110-1 and the first transistor T1 on the base substrate 100, the first pixel electrode 110-1 may be adopted to shield the first gate line G1 and the first transistor T1, so that an occupation area of the first pixel electrode 110-1 in the sub-pixel is increased, and thus a pixel aperture ratio may be increased.

During specific implementation, in the embodiment of the present disclosure, in combination with FIG. 3, for the second gate line G2 and the second pixel electrode 110-2 electrically connected with the second transistor T2, orthographic projections of the second gate line G2 and the second transistor T2 on the base substrate 100 have overlapping regions with the orthographic projection of the second pixel electrode 110-2 on the base substrate 100. For example, the orthographic projection of the second pixel electrode 110-2 on the base substrate 100 covers the orthographic projection of the second transistor T2 on the base substrate 100, and the orthographic projection of the second pixel electrode 110-2 on the base substrate 100 has an overlapping region with the orthographic projection of the second gate line G2 on the base substrate 100. Since a film layer where the second gate line G2 and the second transistor T1 are located is between the second pixel electrode 110-2 and the base substrate 100, and the orthographic projection of the second gate line G2 on the base substrate 100 has an overlapping region with the orthographic projections of the second pixel electrode 110-2 and the second transistor T2 on the base substrate 100, the second pixel electrode 110-2 may be adopted to shield the second gate line G2 and the second transistor T2, so that an occupation area of the second pixel electrode 110-2 in the sub-pixel is increased, and thus a pixel aperture ratio may be increased.

During specific implementation, in the embodiment of the present disclosure, in combination with FIG. 3, an orthographic projection of the third gate line G3 on the base substrate 100 has overlapping regions with orthographic projections of the third transistor T3 electrically connected with the third gate line, the first pixel electrode 110-1 an the second pixel electrode 110-2 on the base substrate 100, and the orthographic projections of the first through hole 111 and the second through hole 112 on the base substrate 100 do not overlap with the orthographic projections of the source conducting layer and the gate conducting layer on the base substrate 100. In this way, the third gate line G3 and the third transistor T3 may be prevented from shielding the first through hole 111 and the second through hole 112, thereby lowering the influence of the third gate line G3 and the third transistor T3 on the display effect.

During specific implementation, in the embodiment of the present disclosure, in combination with FIG. 3, the first pixel electrode 110-1 may be provided with one first through hole 111. For example, the area of the first through hole 111 may be set as 208.377 μm². Exemplarily, the shape of the first through hole 111 may be set as a rectangle, long sides of the rectangle extend in the row direction F1, short sides of the rectangle may extend in the column direction F2, and a width of the long sides may be 2-3 times a width of the short sides. In practical applications, lengths of the long sides and the short sides of the first through hole 111 may be set according to the requirements of the practical applications, which is not limited here.

During specific implementation, in the embodiment of the present disclosure, in combination with FIG. 3 and FIG. 5, the source connecting part 1523 may be set to be in the form of a curve or a zigzag. The second through hole 112 may include a first sub through hole 112-1 and a second sub through hole 112-2 disposed in a spaced manner, that is, the second pixel electrode 110-2 may be provided with one first sub through hole 112-1 and one second sub through hole 112-2, and in this way, the second through hole may be halved, thereby being disposed in the second pixel electrode 110-2 in a dispersed manner. Exemplarily, an area of the first sub through hole 112-1 and an area of the second sub through hole 112-2 may be substantially the same. For example, the area of the first sub through hole 112-1 may be set as 4.008 μm². Exemplarily, the shape of the first sub through hole 112-1 may be set as a rectangle, long sides of the rectangle extend in the column direction F2, short sides of the rectangle may extend in the row direction F1, and a width of the long sides may be 1.5-2 times a width of the short sides. The shape of the second sub through hole 112-2 may be a rectangle, long sides of the rectangle extend in the column direction F2, and short sides of the rectangle may extend in the row direction F1. Of course, in practical applications, the long sides and the short sides of the first sub through hole 112-1 and the second sub through hole 112-2 may be designed according to the requirements of the practical application environment, which is not limited here.

Exemplarily, when the second through hole 112 includes the first sub through hole 112-1 and the second sub through hole 112-2, during specific implementation, in the embodiment of the present disclosure, in combination with FIG. 3, for the second gate line G2, the third gate line G3 which are electrically connected in the same row of sub-pixels, the first sub through hole 112-1 and the second sub through hole 112-2, the orthographic projections of the first sub through hole 112-1 and the second sub through hole 112-2 on the base substrate 110 are between the orthographic projections of the second gate line G2 and the third gate line G3 on the base substrate 100.

Exemplarily, during specific implementation, in the embodiment of the present disclosure, in combination with FIG. 3, for one sub-pixel group, the orthographic projection of the first sub through hole 112-1 on the base substrate 100 is closer to the orthographic projection of the data line DA on the base substrate 100 relative to the orthographic projection of the second sub through hole 112-2 on the base substrate 100. Exemplarily, in each sub-pixel group, the orthographic projection of the first sub through hole 112-1 on the base substrate 100 may be closer to the orthographic projection of the data line DA on the base substrate 100 relative to the orthographic projection of the second sub through hole 112-2 on the base substrate 100.

Exemplarily, in combination with FIG. 3, for one sub-pixel group, the orthographic projection of the second sub through hole 112-2 on the base substrate 100 is farther away from the orthographic projection of the data line DA electrically connected with the sub-pixels on the base substrate 100 relative to the orthographic projection of the first sub through hole 112-1 on the base substrate 100.

It needs to be noted that, for one sub-pixel group, the first sub through hole 112-1 is disposed close to the data line DA electrically connected with the sub-pixels, and the second sub through hole 112-2 is disposed away from the data line DA of the sub-pixels, so that the first sub through hole 112-1 and the second sub through hole 112-2 in the second partition Q-2 may be disposed in a dispersed manner, and thus the first sub through hole 112-1 and the second sub through hole 112-2 may be flexibly disposed according to a space in the second partition Q-2.

Exemplarily, in combination with FIG. 3, in the same row of sub-pixel groups, the orthographic projection of the third gate line G3 on the base substrate 100 is between the orthographic projection of the first gate line G1 on the base substrate 100 and the orthographic projection of the second gate line G2 on the base substrate 100.

Exemplarily, in combination with FIG. 3, the orthographic projection of the first sub through hole 112-1 on the base substrate 100 may be between the orthographic projection of the first sub source connecting part 15231 on the base substrate 100 and the orthographic projection of the data line DA on the base substrate 100, and the orthographic projection of the first sub through hole 112-1 on the base substrate 100 may be between the orthographic projection of the second sub source connecting part 15232 on the base substrate 100 and the orthographic projection of the third gate line G3 on the base substrate 100.

Further, in combination with FIG. 3, in the same sub-pixel group, the orthographic projection of the first sub through hole 112-1 on the base substrate 100 is located on one side, close to the orthographic projection of the data line DA on the base substrate 100, of the orthographic projection of the source connecting part 1523 on the base substrate 100; the orthographic projection of the second source electrode part 1423 on the base substrate 100 is located on one side, away from the orthographic projection of the data line DA on the base substrate 100, of the orthographic projection of the source connecting part 1523 on the base substrate; and the orthographic projection of the second sub through hole 112-2 on the base substrate 100 is located on one side, away from the orthographic projection of the source connecting part 1523 on the base substrate 100, of the orthographic projection of the second source electrode part 1423 on the base substrate 100.

Exemplarily, in combination with FIG. 3, the orthographic projection of the first sub through hole 112-1 on the base substrate 100 may be located between the orthographic projection of the first sub source connecting part 15231 on the base substrate 100 and the orthographic projection of the data line DA on the base substrate 100, and the orthographic projection of the first sub through hole 112-1 on the base substrate 100 may be located between the orthographic projection of the second sub source connecting part 15232 on the base substrate 100 and the orthographic projection of the first gate line G1 on the base substrate 100.

Figure 6A:
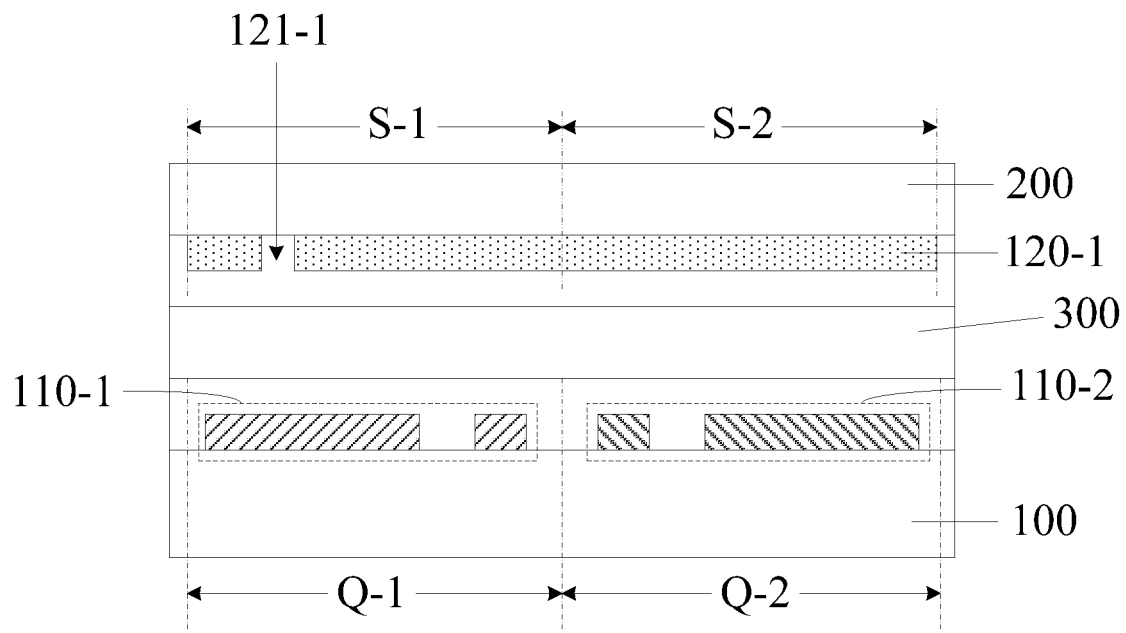
FIG. 6A is a schematic cross-sectional diagram in a direction AA' in the schematic diagram shown in FIG. 5.
Figure 6B:
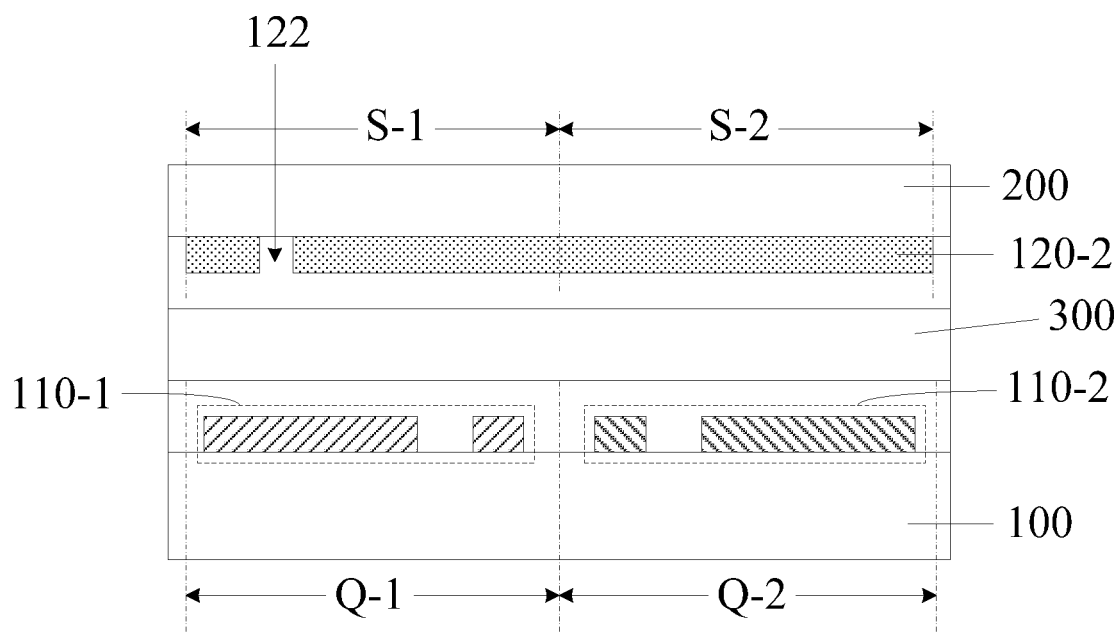
FIG. 6B is a schematic cross-sectional diagram in a direction BB' in the schematic diagram shown in FIG. 5.
Figure 6C:
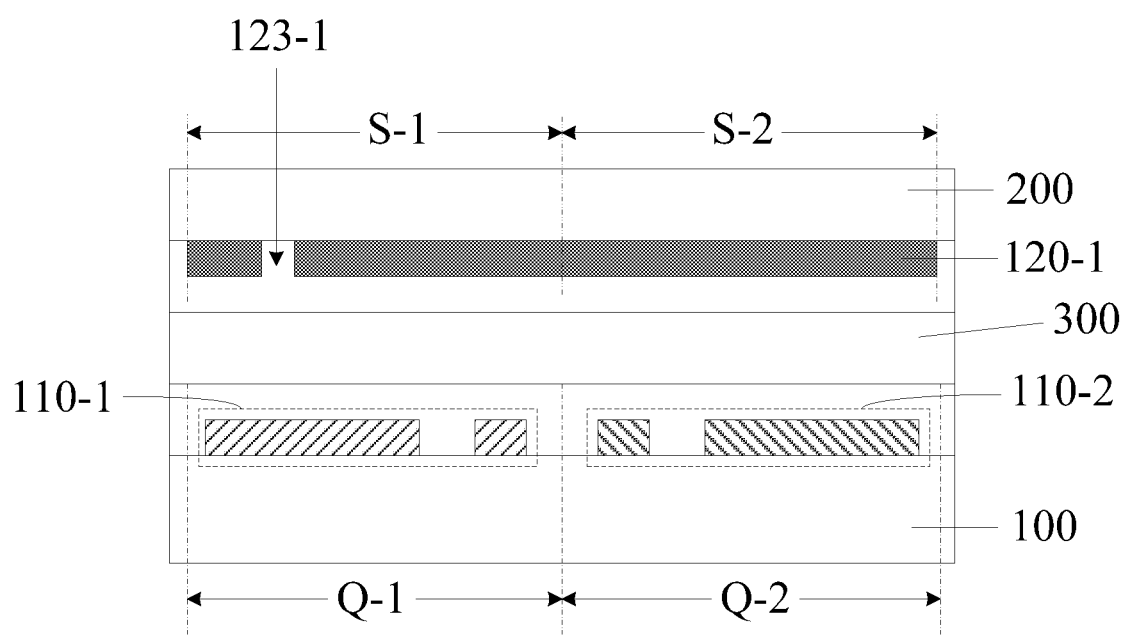
FIG. 6C is a schematic cross-sectional diagram in a direction CC' in the schematic diagram shown in FIG. 5.
Figure 7:
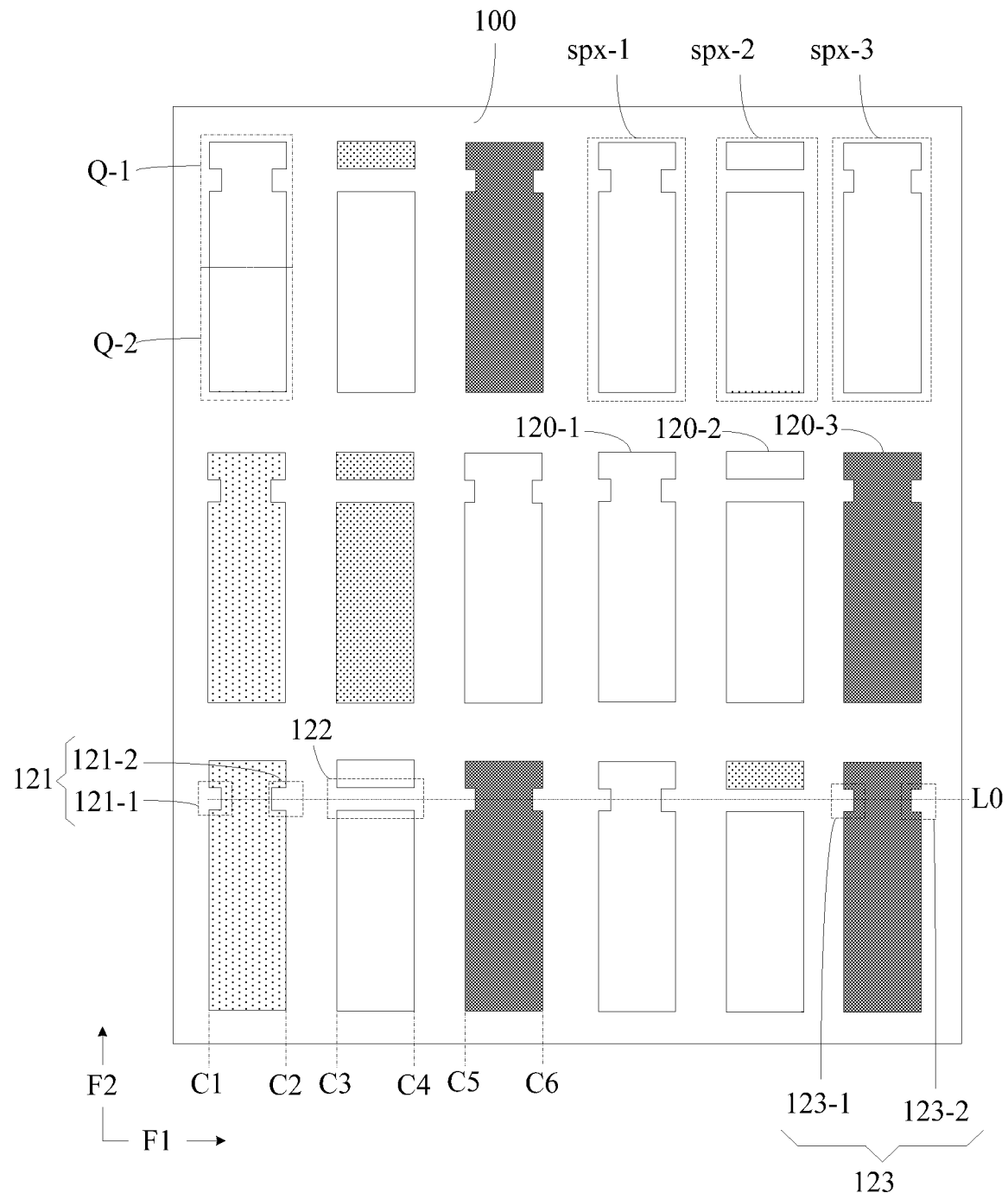
FIG. 7 is a schematic structural diagram of some sub color resistance layers provided by an embodiment of the present disclosure.

Exemplarily, as shown in FIG. 5, FIG. 6A and FIG. 7, in the first-color sub-pixel group spx-1 (such as the red sub-pixel group), the sub color resistance layer located in the first partition Q-1 is provided with a first via hole 121, and the first via hole 121 penetrates through the sub color resistance layer 120-1. As shown in FIG. 5, FIG. 6B and FIG. 7, in the second-color sub-pixel group spx-2 (such as the green sub-pixel group), the sub color resistance layer located in the first partition Q-1 is provided with a first via hole 122, and the first via hole 122 penetrates through the sub color resistance layer 120-2. As shown in FIG. 5, FIG. 6C and FIG. 7, in the third-color sub-pixel group spx-3 (such as the blue sub-pixel group), the sub color resistance layer located in the first partition Q-1 is provided with a first via hole 123, and the first via hole 123 penetrates through the sub color resistance layer 120-3.

Generally, human eyes have different sensitiveness to light of different colors, for example, human eyes have the highest sensitiveness to green, secondary sensitiveness to red, and the lowest sensitiveness to blue. If areas of the first via holes in the sub-pixels of the different colors are set to be the same, human eyes will feel a relatively green picture when looking at the picture displayed on the display panel. In order to improve the display effect, sizes of the first via holes in the sub-pixels of the different colors may be designed according to the sensitiveness of human eyes to red, green and blue. During specific implementation, as shown in FIG. 5, the area of the first via hole 122 in the second-color sub-pixel group spx-2 may be greater than the area of the first via hole 121 in the first-color sub-pixel group spx-1, and the area of the first via hole 121 in the first-color sub-pixel group spx-1 may be greater than the area of the first via hole 123 in the third-color sub-pixel group spx-3. Exemplarily, the area of the first via hole in the green sub-pixel group may be greater than the area of the first via hole in the red sub-pixel group, and the area of the first via hole in the red sub-pixel group may be greater than the area of the first via hole in the blue sub-pixel group. In this way, green light emission of the green sub-pixel group may be lowered, and thus the problem of the relatively green picture may be alleviated.

During specific implementation, in the embodiment of the present disclosure, as shown in FIG. 5 and FIG. 7, the first-color sub-pixel group spx-1 may have a first side C1 and a second side C2 opposite to each other. The first side C1 and the second side C2 are arranged in the row direction F1. The first via hole 121 in the first-color sub-pixel group spx-1 may include a first sub via hole 121-1 and a second sub via hole 121-2. The first sub via hole 121-1 is located at the first side C1, and the second sub via hole 121-2 is located at the second side C2. In this way, the first sub via hole 121-1 and the second sub via hole 121-2 may be disposed at edges of the sub color resistance layer respectively.

During specific implementation, in the embodiment of the present disclosure, as shown in FIG. 5 and FIG. 7, an area of the first sub via hole 121-1 and an area of the second sub via hole 121-2 may be substantially the same. In this way, the first sub via hole 121-1 and the second sub via hole 121-2 may be prepared together to lower the process preparation difficulty. Exemplarily, an orthographic projection of the first sub via hole 121-1 on the base substrate 100 and an orthographic projection of the second sub via hole 121-2 on the base substrate 100 may be substantially the same in shape, and the orthographic projection of the first sub via hole 121-1 on the base substrate 100 and the orthographic projection of the second sub via hole 121-2 on the base substrate 100 may be substantially the same in area. For example, the shape of the first sub via hole 121-1 and the second sub via hole 121-2 may be set as a rectangle, long sides of the rectangle extend in the column direction F2, and short sides of the rectangle extend in the row direction F1. The area of the rectangle may be set as 200 $\mu m^2$. Exemplarily, the long sides of the rectangle may be 2-3 times the short sides thereof. Of course, in practical applications, display panels in different application environments have different requirements, and thus the area of the first sub via hole 121-1 and the second sub via hole 121-2 may be designed according to the practical application environment, which is not limited here.

During specific implementation, in the embodiment of the present disclosure, as shown in FIG. 5 and FIG. 7, the second-color sub-pixel group spx-2 has a third side C3 and a fourth side C4 opposite to each other. The third side C3 and the fourth side C4 are arranged in the row direction F1. The orthographic projection of the first via hole in the second-color sub-pixel group spx-2 on the base substrate 100 extends from the third side C3 to the fourth side C4. Exemplarily, the first via hole in the second-color sub-pixel group spx-2 may be set as a rectangle, long sides of the rectangle extend in the row direction F1, and short sides of the rectangle extend in the column direction F2. The area of the rectangle may be set as 812 $\mu m^2$. Exemplarily, a width of the long sides of the rectangle may be 2-3 times a width of the short sides thereof. Of course, in practical applications, display panels in different application environments have different requirements, and thus the first via hole in the second-color sub-pixel group spx-2 may be designed according to the practical application environment, which is not limited here.

During specific implementation, in the embodiment of the present disclosure, as shown in FIG. 5 and FIG. 7, the third-color sub-pixel group spx-3 has a fifth side C5 and a sixth side C6 opposite to each other. The fifth side C5 and the sixth side C6 are arranged in the row direction F1. The first via hole in the third-color sub-pixel group spx-3 may include a third sub via hole 123-1 and a fourth sub via hole 123-2. The third sub via hole 123-1 is located at the fifth side C5, and the fourth sub via hole 123-2 is located at the sixth side C6. In this way, the third sub via hole 123-1 and the fourth sub via hole 123-2 may be disposed at edges of the sub color resistance layer respectively.

During specific implementation, in the embodiment of the present disclosure, as shown in FIG. 5 and FIG. 7, an area of the third sub via hole 123-1 and an area of the fourth sub via hole 123-2 may be substantially the same. In this way, the third sub via hole 123-1 and the fourth sub via hole 123-2 may be prepared together to lower the process preparation difficulty. Exemplarily, an orthographic projection of the third sub via hole 123-1 on the base substrate 100 and an orthographic projection of the fourth sub via hole 123-2 on the base substrate 100 may be substantially the same in shape, and the orthographic projection of the third sub via hole 123-1 on the base substrate 100 and the orthographic projection of the fourth sub via hole 123-2 on the base substrate 100 may be substantially the same in area. For example, the shape of the third sub via hole 123-1 and the fourth sub via hole 123-2 may be set as a rectangle, long sides of the rectangle extend in the column direction F2, and short sides of the rectangle extend in the row direction F1. The area of the rectangle may be set as 157 $\mu m^2$. Exemplarily, a length of the long sides may be set to be 2-3 times a length of the short sides. Of course, in practical applications, display panels in different application environments have different requirements, and thus the area of the third sub via hole 123-1 and the fourth sub via hole 123-2 may be designed according to the practical application environment, which is not limited here.

Figure 10:
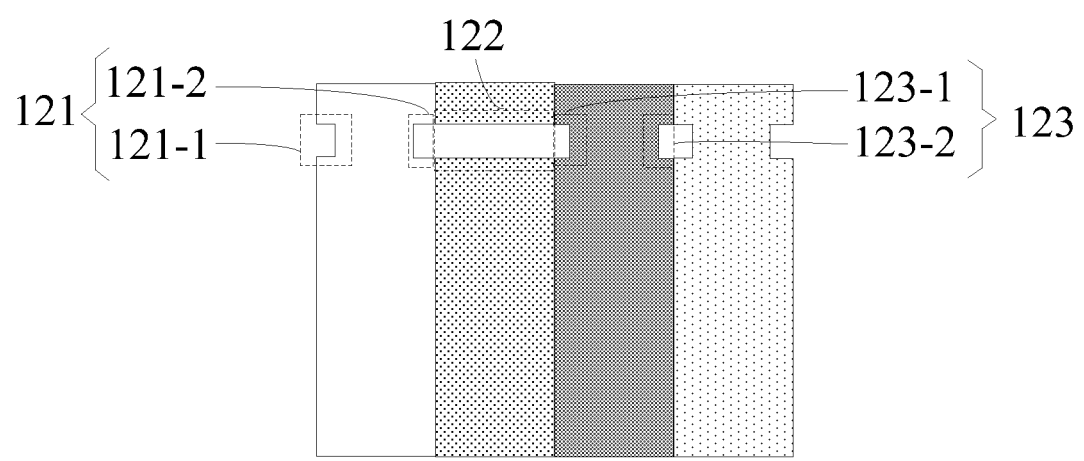
FIG. 10 is a schematic structural diagram of some other sub color resistance layers provided by an embodiment of the present disclosure.

During specific implementation, in the embodiment of the present disclosure, as shown in FIG. 7, a center of the first via hole in the first-color sub-pixel group spx-1, a center of the first via hole in the second-color sub-pixel group spx-2 and a center of the first via hole in the third-color sub-pixel group spx-3 may be arranged on the same straight line LO in the row direction F1. In this way, the design difficulty of these first via holes may be lowered. In practical applications, the sub color resistance layers in every two adjacent sub-pixel groups may have an overlapping region or may be adjacent. As shown in FIG. 10, when the sub color resistance layers in every two adjacent sub-pixel groups are adjacent, and when the first via holes are rectangular, the long sides of the first sub via hole 121-1 in the first-color sub-pixel group spx-1 may coincide with the long sides of the fourth sub via hole 123-2 in the third-color sub-pixel group spx-3. The long sides of the second sub via hole 121-2 in the first-color sub-pixel group spx-1 may coincide with the short sides of the first via hole located at the third side C3 in the second-color sub-pixel group spx-2. The short sides of the second sub via hole 121-2 located at the fourth side C4 in the first-color sub-pixel group spx-1 may coincide with the long sides of the third sub via hole 123-1 in the third-color sub-pixel group spx-3.

It needs to be noted that the row direction F1 may be the row direction of the sub-pixels, and the column direction F2 may be the column direction of the sub-pixels. Or, the row direction F1 may also be the column direction of the sub-pixels, and the column direction F2 may be the row direction of the sub-pixels. In practical applications, it may be designed and determined according to the practical application environment, which is not limited here.

It needs to be noted that, in an actual process, due to the limitation of process conditions or other factors, the same of the above features cannot be exactly the same, and there may be some deviations. Therefore, as long as the same relationship between the above features roughly meets the above conditions, it belongs to the protection scope of the present disclosure. For example, the same above may be the same allowed within an error allowance range.

Figure 11:
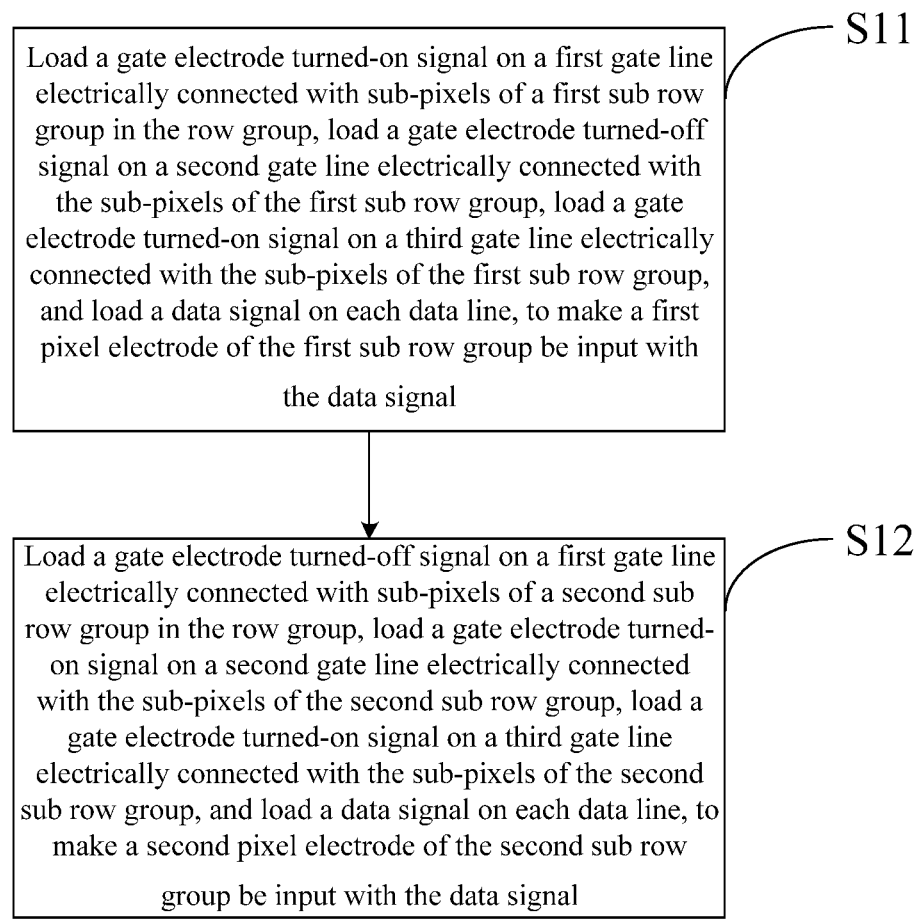
FIG. 11 is flow diagram of some driving methods provided by an embodiment of the present disclosure.

An embodiment of the present disclosure further provides a driving method of a display panel. The driving method may include: driving sub-pixels in one row group in each data input stage in one frame of time. The driving the sub-pixels in the row group in the data input stage, as shown in FIG. 11, may include the following steps.

S11, a gate electrode turned-on signal is loaded on a first gate line electrically connected with sub-pixels of a first sub row group in the row group, a gate electrode turned-off signal is loaded on a second gate line electrically connected with the sub-pixels of the first sub row group, a gate electrode turned-on signal is loaded on a third gate line electrically connected with the sub-pixels of the first sub row group, and a data signal is loaded on each data line, to make a first pixel electrode of the first sub row group be input with the data signal.

S12, a gate electrode turned-off signal is loaded on a first gate line electrically connected with sub-pixels of a second sub row group in the row group, a gate electrode turned-on signal is loaded on a second gate line electrically connected with the sub-pixels of the second sub row group, a gate electrode turned-on signal is loaded on a third gate line electrically connected with the sub-pixels of the second sub row group, and a data signal is loaded on each data line, to make a second pixel electrode of the second sub row group be input with the data signal.

Figure 12:
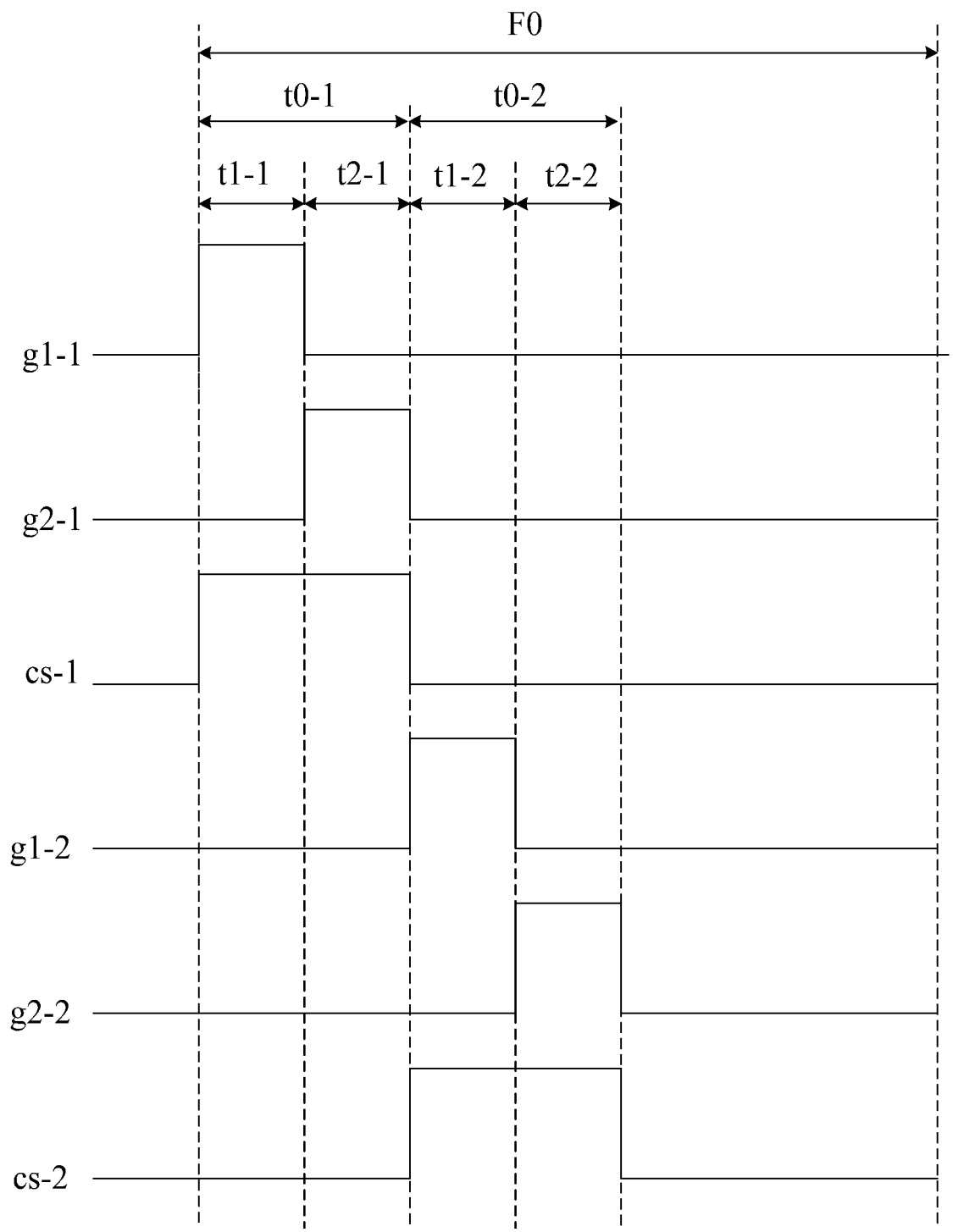
FIG. 12 is some signal sequence diagrams provided by an embodiment of the present disclosure.

By taking the structures of the first pixel electrode 110-1 and the second pixel electrode 110-2 shown in FIG. 3 as an example, a working process of the display panel provided by the embodiment of the present disclosure is illustrated below in combination with a signal sequence diagram shown in FIG. 12.

One frame of display time may include: n number of data input stages t0-$n$, where the $n^{th}$ data input stage t0-$n$ includes: stages t1-$n$ and t2-$n$. In the stage t1-$n$, a first gate line G1-$n$ and a third gate line G3-$n$ electrically connected with the $n^{th}$ row of sub-pixel groups input the gate electrode turned-on signals, respectively. In the stage t2-$n$, a second gate line G2-$n$ and the third gate line G3-$n$ electrically connected with the $n^{th}$ row of sub-pixel groups input the gate electrode turned-on signals, respectively. In the following, a first sub row group (e.g., the first row of sub-pixels) and a second sub row group (e.g., the second row of sub-pixels) in the first row group PXZ-1 and a first sub row group (e.g., the third row of sub-pixels) and a second sub row group (e.g., the fourth row of sub-pixels) in the second row group PXZ-2 are taken as examples for illustration.

The first data input stage t0-1 includes: stages t1-1 and t2-1. The second data input stage t0-2 includes: stages t1-2 and t2-2. g1-1 is a signal input by the first gate line G1-1 electrically connected with the first row of sub-pixels, and g2-1 is a signal input by the second gate line G2-1 electrically connected with the second row of sub-pixels. g3-1 is a signal input by the third gate line G3-1 of the first row group PXZ-1. g1-2 is a signal input by the first gate line G1-2 electrically connected with the third row of sub-pixels, and g2-2 is a signal input by the second gate line G2-2 electrically connected with the fourth row of sub-pixels. g3-2 is a signal input by the third gate line G3-2 of the second row group PXZ-2.

In the stage t1-1, a low-level signal is input by the second gate line G2-1 electrically connected with the second row of sub-pixels to control all second transistors T2 in the second row of sub-pixels to be turned off. A low-level signal is input by the first gate line G1-2 electrically connected with the third row of sub-pixels to control all first transistors T1 in the third row of sub-pixels to be turned off. A low-level signal is input by the second gate line G2-2 electrically connected with the fourth row of sub-pixels to control all second transistors T2 in the fourth row of sub-pixels to be turned off. A low-level signal is input by the third gate line G3-2 of the second row group PXZ-2 to control all third transistors T3 in the second row group PXZ-2 to be turned off. A high-level signal is input by the first gate line G1-1 electrically connected with the first row of sub-pixels to control all first transistors T1 in the first row of sub-pixels to be turned on. A high-level signal is input by the third gate line G3 of the first row group PXZ-1 to control all third transistors T3 in the second row group PXZ-2 to be turned on. The data signals are loaded on the data lines DA to make the first pixel electrode 110-1 in the first row of sub-pixels be input with the data signals.

In the stage t2-1, a low-level signal is input by the first gate line G1-1 electrically connected with the first row of sub-pixels to control all the first transistors T1 in the first row of sub-pixels to be turned off. A low-level signal is input by the second gate line G2-1 electrically connected with the second row of sub-pixels to control all the second transistors T2 in the second row of sub-pixels to be turned off. A low-level signal is input by the first gate line G1-2 electrically connected with the third row of sub-pixels to control all the first transistors T1 in the third row of sub-pixels to be turned off. A low-level signal is input by the third gate line G3 of the second row group PXZ-2 to control all the third transistors T3 in the second row group PXZ-2 to be turned off. A high-level signal is input to the second gate line G2-1 electrically connected with the second row of sub-pixels to control all the second transistors T2 in the second row of sub-pixels to be turned on. A high-level signal is input by the third gate line G3 of the first row group PXZ-1 to control all the third transistors T3 in the first row group PXZ-1 to be turned on. The data signals are loaded on the data lines DA to make the second pixel electrode 110-2 in the second row of sub-pixels be input with the data signals.

In the stage t1-2, a low-level signal is input by the first gate line G1-1 electrically connected with the first row of sub-pixels to control all the first transistors T1 in the first row of sub-pixels to be turned off. A low-level signal is input by the second gate line G2-1 electrically connected with the second row of sub-pixels to control all the second transistors T2 in the second row of sub-pixels to be turned off. A low-level signal is input by the second gate line G2-2 electrically connected with the fourth row of sub-pixels to control all the second transistors T2 in the fourth row of sub-pixels to be turned off. A low-level signal is input by the third gate line G3 of the second row group PXZ-2 to control all the third transistors T3 in the second row group PXZ-2 to be turned off. A high-level signal is input by the first gate line G1-2 electrically connected with the third row of sub-pixels to control all the first transistors T1 in the third row of sub-pixels to be turned on. A high-level signal is input by the third gate line G3-2 of the second row group PXZ-2 to control all the third transistors T3 in the second row group PXZ-2 to be turned on. The data signals are loaded on the data lines DA to make the first pixel electrode 110-1 in the third row of sub-pixels be input with the data signals.

In the stage t2-2, a low-level signal is input by the first gate line G1-1 electrically connected with the first row of sub-pixels to control all the first transistors T1 in the first row of sub-pixels to be turned off. A low-level signal is input by the second gate line G2-1 electrically connected with the second row of sub-pixels to control all the second transistors T2 in the second row of sub-pixels to be turned off. A low-level signal is input by the first gate line G1-2 electrically connected with the third row of sub-pixels to control all the first transistors T1 in the third row of sub-pixels to be turned off. A low-level signal is input by the third gate line G3-1 of the first row group PXZ-1 to control all the third transistors T3 in the first row group PXZ-1 to be turned off. A high-level signal is input by the second gate line G2-2 electrically connected with the fourth row of sub-pixels to control all the second transistors T2 in the fourth row of sub-pixels to be turned on. A high-level signal is input by the third gate line G3-2 of the second row group PXZ-2 to control all the third transistors T3 in the second row group PXZ-2 to be turned on. The data signals are loaded on the data lines DA to make the second pixel electrode 110-2 in the fourth row of sub-pixels be input with the data signals.

The other processes are analogized and will not be repeated here.

Exemplarily, a red sub-pixel group is taken as an example for illustration. When the display panel is in a reflecting mode, a backlight source is turned off, and a reflecting electrode reflects external environment light to make the display panel perform displaying. If within one frame of display time, data signals input to reflecting electrodes in a first partition Q-1 and a second partition Q-2 cannot control liquid crystal molecules to overturn, the first partition Q-1 and the second partition Q-2 do not emit light either, and red is used as the first gray scale H1. If within one frame of display time, a data signal input to the first reflecting electrode 110-1 in the first partition Q-1 can control the liquid crystal molecules to overturn and a data signal input to the second reflecting electrode 110-2 in the second partition Q-2 cannot control driving molecules to overturn, the first reflecting electrode 110-1 in the first partition Q-1 may reflect incident light, so that only the first partition Q-1 is made to emit light, and red is used as the second gray scale H2. If within one frame of display time, a data signal input to the first reflecting electrode 110-1 in the first partition Q-1 cannot control the driving molecules to overturn and a data signal input to the second reflecting electrode 110-2 in the second partition Q-2 can control the driving molecules to overturn, the second reflecting electrode 110-2 in the second partition Q-2 may reflect incident light, so that only the second partition Q-2 is made to emit light, and red is used as the third gray scale H3. If within one frame of display time, a data signal input to the first reflecting electrode 110-1 in the first partition Q-1 can control the driving molecules to overturn and a data signal input to the second reflecting electrode 110-2 in the second partition Q-2 can also control the driving molecules to overturn, the first reflecting electrode 110-1 in the first partition Q-1 may reflect incident light, and the second reflecting electrode 110-2 in the second partition Q-2 may also reflect incident light, so that both the first partition Q-1 and the second partition Q2 are made to emit light, and red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

Exemplarily, the red sub-pixel group is taken as an example for illustration. When the display panel is in a transmission mode, the backlight source works, and light emitted by the backlight source is transmitted via through holes to make the display panel perform displaying. If within one frame of display time, the data signals input to the reflecting electrodes in the first partition Q-1 and the second partition Q-2 cannot control the liquid crystal molecules to overturn, the first partition Q-1 and the second partition Q-2 do not emit light either, and red is used as the first gray scale H1. If within one frame of display time, the data signal input to the first reflecting electrode 110-1 in the first partition Q-1 can control the driving molecules to overturn and the data signal input to the second reflecting electrode 110-2 in the second partition Q-2 cannot control the driving molecules to overturn, light of the backlight source may penetrate through a first through hole 111 and be emitted through the first partition Q-1, so that only the first partition Q-1 is made to emit light, and red is used as the second gray scale H2. If within one frame of display time, the data signal input to the first reflecting electrode 110-1 in the first partition Q-1 cannot control the driving molecules to overturn and the data signal input to the second reflecting electrode 110-2 in the second partition Q-2 can control the driving molecules to overturn, light of the backlight source may penetrate through a second through hole 112 and be emitted through the second partition Q-2, so that only the second partition Q-2 is made to emit light, and red is used as the third gray scale H3. If within one frame of display time, the data signal input to the first reflecting electrode 110-1 in the first partition Q-1 can control the driving molecules to overturn and the data signal input to the second reflecting electrode 110-2 in the second partition Q-2 can also control the driving molecules to overturn, light of the backlight source may penetrate through the first through hole 111 and be emitted through the first partition Q-1, and the light of the backlight source may penetrate through the second through hole 112 and be emitted through the second partition Q-2, so that both the first partition Q-1 and the second partition Q-2 are made to emit light, and red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

Figure 13:
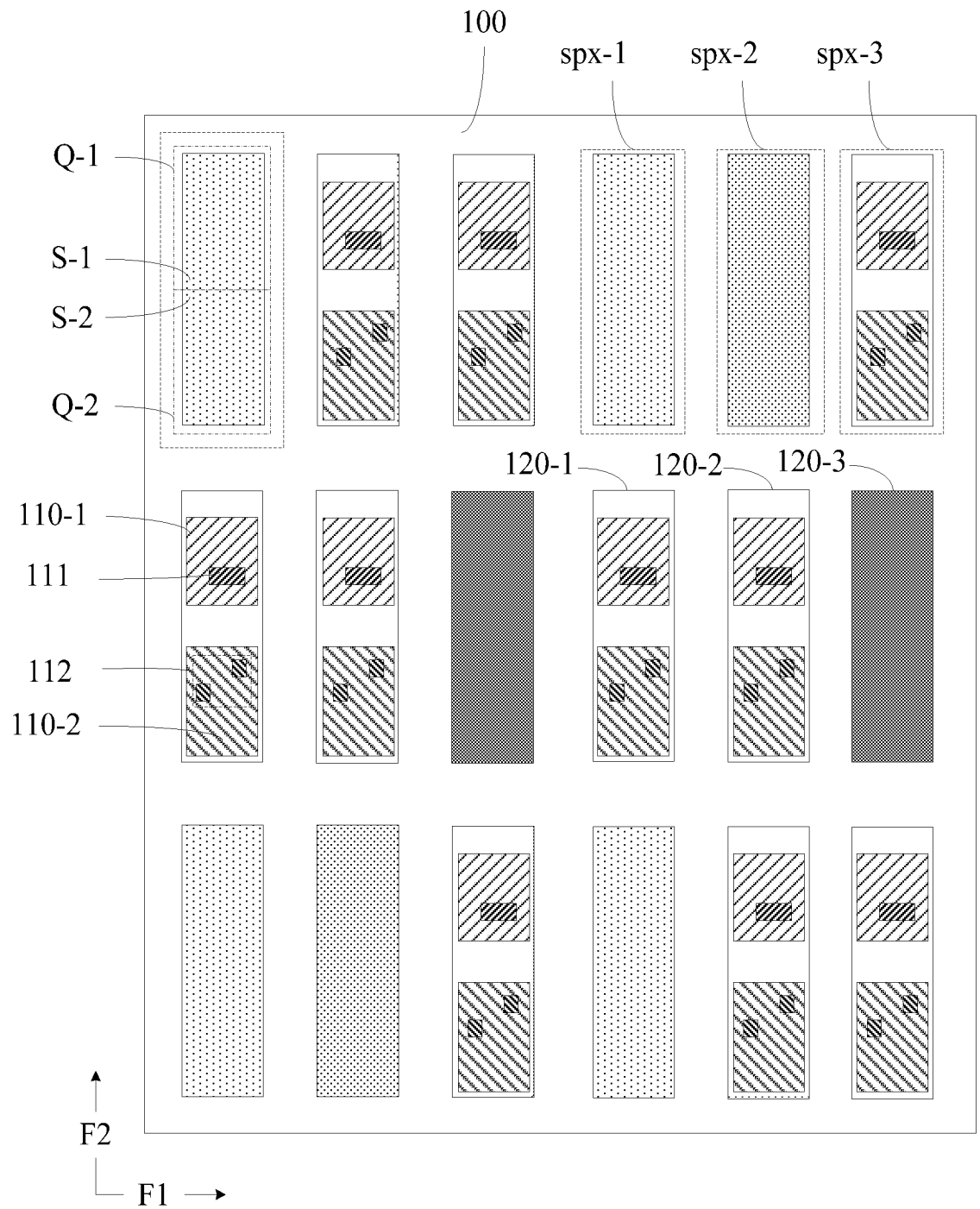
FIG. 13 is a schematic structural diagram of further some display panels provided by an embodiment of the present disclosure.

An embodiment of the present disclosure further provides some display panels, the schematic structural diagram thereof is as shown in FIG. 13, and transformation is performed for the implementation of the above embodiments. Only the difference between the present embodiment and the above embodiments is explained below, and similarities are omitted here.

During specific implementation, in the embodiment of the present disclosure, in the same sub-pixel, an area of a first pixel electrode 110-1 may be smaller than an area of a second pixel electrode 110-2, and an area of a first sub color resistance region S-1 may be substantially equal to an area of a second sub color resistance region S-2. Exemplarily, as shown in FIG. 13, in each first-color sub-pixel group spx-1, the area of the first pixel electrode 110-1 is smaller than the area of the second pixel electrode 110-2, and the area of the first sub color resistance region S-1 is substantially equal to the area of the second sub color resistance region S-2. In each second-color sub-pixel group spx-2, the area of the first pixel electrode 110-1 is smaller than the area of the second pixel electrode 110-2, and the area of the first sub color resistance region S-1 is substantially equal to the area of the second sub color resistance region S-2. In each third-color sub-pixel group spx-3, the area of the first pixel electrode 110-1 is smaller than the area of the second pixel electrode 110-2, and the area of the first sub color resistance region S-1 is substantially equal to the area of the second sub color resistance region S-2.

It needs to be noted that, when the display panel is in a reflecting mode, since the area of the first pixel electrode 110-1 is smaller than the area of the second pixel electrode 110-2, the brightness of a first partition Q-1 may be lower than the brightness of a second partition Q-2, so that the display panel may achieve 64 gray scales. Exemplarily, a red sub-pixel group is taken as an example for illustration. When the display panel is in the reflecting mode, a backlight source is turned off, and a reflecting electrode reflects external environment light to make the display panel perform displaying. If within one frame of display time, the first partition Q-1 and the second partition Q-2 do not emit light either, red is used as the first gray scale H1. If within one frame of display time, only the first partition Q-1 emits light, red is used as the second gray scale H2. If within one frame of display time, only the second partition Q-2 emits light, red is used as the third gray scale H3. If within one frame of display time, both the first partition Q-1 and the second partition Q-2 emit light, red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

During specific implementation, implementations of a second through hole 112 and a first through hole 111 can refer to the above implementations, which are omitted here.

It needs to be noted that, when the display panel is in a transmission mode, since the area of the first pixel electrode 110-1 and the area of the second pixel electrode 110-2 are different, the brightness of a first reflecting region and the brightness of a second reflecting region may be different, so that the display panel may achieve 64 gray scales. Exemplarily, the red sub-pixel group is taken as an example for illustration. When the display panel is in the transmission mode, the backlight source works, and light emitted by the backlight source is transmitted via through holes to make the display panel perform displaying. If within one frame of display time, the first partition Q-1 and the second partition Q-2 do not emit light either, red is used as the first gray scale H1. If within one frame of display time, only the first partition Q-1 emits light, red is used as the second gray scale H2. If within one frame of display time, only the second partition Q-2 emits light, red is used as the third gray scale H3. If within one frame of display time, both the first partition Q-1 and the second partition Q-2 emit light, red is used as the fourth gray scale H4. H1<H2<H3<H4. In other words, H1 may be the lowest gray scale of red, and H4 may be the highest gray scale of red. Therefore, in one pixel unit, a red part may have 4 gray scales from a dark state to a bright state. Similarly, in one pixel unit, a green part may also have 4 gray scales from a dark state to a bright state, and a blue part may also have 4 gray scales from a dark state to a bright state. In this way, one pixel unit may display 64 gray scales of a color.

It needs to be noted that a working process of the display panel in the present embodiment can refer to the working process of the display panel in the above embodiments, which is not specifically repeated here.

Based on the same inventive concept, an embodiment of the present disclosure further provides a display device, including the display panel provided by the embodiment of the present disclosure. The principle for solving problems of the display device is similar to that of the aforementioned display panel, and thus the implementation of the display device can refer to the implementation of the aforementioned display panel, and repetitions are omitted here.

During specific implementation, in the embodiment of the present disclosure, the display device may further include a backlight source. The backlight source may be located on one side of a base substrate away from an opposite substrate. The backlight source may be a direct type backlight source or a side-entry type backlight source, and its specific setting manner may be designed and determined according to the practical application environment, which is not limited here.

During specific implementation, in the embodiment of the present disclosure, the display device may be: a mobile phone, a tablet computer, a television, a display, a laptop, a digital photo frame, a navigator and any product or component with a display function. Other essential components of the display device shall be understood by those of ordinary skill in the art, and is omitted herein and also shall not become a restriction to the present disclosure.

Although the preferred embodiments of the present disclosure have been described, those skilled in the art can make additional changes and modifications on these embodiments once they know the basic creative concept. So the appended claims are intended to be construed to include the preferred embodiments and all changes and modifications that fall into the scope of the present disclosure.

Apparently, those skilled in the art can make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and their equivalent technologies, the present disclosure is also intended to include these modifications and variations.

What is claimed is:

1. A display panel, comprising:
a base substrate;
a plurality of sub-pixels on the base substrate, wherein at least one of the plurality of sub-pixels comprises a pixel electrode;
a plurality of transistors, comprising a plurality of first transistors, a plurality of second transistors and a plurality of third transistors;
a plurality of data lines, disposed on the base substrate at intervals; and
a plurality of gate lines, disposed on the base substrate at intervals, and comprising a plurality of first gate lines, a plurality of second gate lines and a plurality of third gate lines; wherein:
two adjacent rows of sub-pixels are taken as a row group, and the row group has a first sub row group and a second sub row group arranged in a column direction; the pixel electrode comprises a first pixel electrode and a second pixel electrode;
one sub-pixel in the first sub row group comprises one first transistor of the plurality of first transistors and one first pixel electrode; wherein a gate electrode of the first transistor in the first sub row group is electrically connected with one first gate line of the plurality of first gate lines; in the same sub-pixel, a second electrode of the first transistor is electrically connected with the first pixel electrode;
one sub-pixel in the second sub row group comprises one second transistor of the plurality of second transistors and one second pixel electrode; wherein a gate electrode of the second transistor in the second sub row group is electrically connected with one second gate line of the plurality of second gate lines; in the same sub-pixel, a second electrode of the second transistor is electrically connected with the second pixel electrode;
in the same row group, two adjacent sub-pixels in the column direction share one third transistor of the plurality of third transistors; wherein a gate electrode of the third transistor in the row group is electrically connected to one third gate line of the plurality of third gate lines; and
the first transistor and the second transistor in one column of sub-pixels are electrically connected with one data line of the plurality of data lines through the shared third transistor;
wherein an active layer of the third transistor comprises a first source electrode region, a first drain electrode region, a second drain electrode region, a first channel region and a second channel region;
wherein the first channel region is between the first source electrode region and the first drain electrode region, and the second channel region is between the first source electrode region and the second drain electrode region; and
the first source electrode region is electrically connected with the data line, the first drain electrode region is electrically connected with a first electrode of the first transistor, and the second drain electrode region is electrically connected with a first electrode of the second transistor.

2. The display panel according to claim 1, wherein in the same row group, two adjacent sub-pixels in the column direction constitute one sub-pixel group; and
the sub-pixel group is configured to be at least a part of a region of one pixel point in a display image.

3. The display panel according to claim 1, further comprising:
a source conducting layer on the base substrate, comprising the plurality of data lines disposed at intervals, a plurality of source connecting parts, a plurality of first source electrode parts and a plurality of second source electrode parts; wherein one source connecting part, one first source electrode part and one second source electrode part are in one sub-pixel group;
the first source electrode part serves as the first electrode of the first transistor, and the second source electrode part serves as the first electrode of the second transistor; and
in the same sub-pixel group, the first source electrode part is electrically connected with the first drain electrode region, the second source electrode part is electrically connected with the second drain electrode region, the first source electrode region is electrically connected with the source connecting part, and the source connecting part is electrically connected with one data line.

4. The display panel according to claim 3, wherein each of the source connecting parts comprises: a first sub source connecting part and a second sub source connecting part electrically connected with each other; wherein the first sub source connecting part extends in a row direction, and the second sub source connecting part extends in the column direction; and the first sub source connecting part is electrically connected with the data line, and the second sub source connecting part is electrically connected with the first source electrode region.

5. The display panel according to claim 1, wherein the pixel electrode is set as a reflecting electrode; and the first pixel electrode is provided with a first through hole, the second pixel electrode is provided with a second through hole, and an arcs a size of the first through hole is different from a size of the second through hole.

6. The display panel according to claim 5, wherein the base substrate has: a first partition and a second partition; wherein the first partition covers one sub-pixel in the sub-pixel group, and the second partition covers another sub-pixel in the sub-pixel group; and
the display panel further comprises:
an opposite substrate, disposed opposite to the base substrate; and
a color resistance layer between the base substrate and the opposite substrate, comprising sub color resistance layers in the sub-pixels; wherein
each of the sub color resistance layers has a first sub color resistance region and a second sub color resistance region, and in a direction perpendicular to a plane where the base substrate is located, the first partition covers the first sub color resistance region, and the second partition covers the second sub color resistance region.

7. The display panel according to claim 6, wherein the first pixel electrode has a first facing size with the sub color resistance layer in the first sub color resistance region;

the second pixel electrode has a second facing size with the sub color resistance layer in the second sub color resistance region; and
in the same sub-pixel group, the first facing size is different from the second facing size.

8. The display panel according to claim 7, wherein in the same sub-pixel group, a size of the first pixel electrode is substantially the same as a size of the second pixel electrode, and a size of the first sub color resistance region is smaller than a size of the second sub color resistance region.

9. The display panel according to claim 8, wherein the sub color resistance layer in the first partition is provided with a first via hole, and the first via hole penetrates through the sub color resistance layer; and
an orthographic projection of the first via hole on the base substrate does not overlap with an orthographic projection of the first through hole on the base substrate.

10. The display panel according to claim 7, wherein in the same sub-pixel group, a size of the first pixel electrode is smaller than a size of the second pixel electrode, and a size of the first sub color resistance region is smaller than or substantially the same as a size of the second sub color resistance region.

11. The display panel according to claim 5, wherein the orthographic projection of the first through hole on the base substrate does not overlap with orthographic projections of the source conducting layer and a gate conducting layer on the base substrate; and
an orthographic projection of the second through hole on the base substrate does not overlap with the orthographic projections of the source conducting layer and the gate conducting layer on the base substrate.

12. The display panel according to claim 11, wherein for the first gate line and the first pixel electrode electrically connected with the first transistor, orthographic projections of the first gate line and the first transistor on the base substrate have overlapping regions with an orthographic projection of the first pixel electrode on the base substrate; and/or
for the second gate line and the second pixel electrode electrically connected with the second transistor, orthographic projections of the second gate line and the second transistor on the base substrate have overlapping regions with an orthographic projection of the second pixel electrode on the base substrate; and/or
an orthographic projection of the third gate line on the base substrate has overlapping regions with the orthographic projections of the third transistor electrically connected with the third gate line, the first pixel electrode and the second pixel electrode on the base substrate.

13. The display panel according to claim 5, wherein the first pixel electrode is provided with one first through hole, and the second through hole comprises a first sub through hole and a second sub through hole disposed at intervals;
for one sub-pixel group, an orthographic projection of the first sub through hole on the base substrate is closer to an orthographic projection of the data line electrically connected with the sub-pixels on the base substrate relative to an orthographic projection of the second sub through hole on the base substrate; and/or
for one sub-pixel group, an orthographic projection of the second sub through hole on the base substrate is farther away from the orthographic projection of the data line electrically connected with the sub-pixels on the base substrate relative to the orthographic projection of the first sub through hole on the base substrate.

14. The display panel according to claim 13, wherein the orthographic projection of the first sub through hole on the base substrate is between an orthographic projection of the first sub source connecting part on the base substrate and an orthographic projection of the data line on the base substrate, and the orthographic projection of the first sub through hole on the base substrate is between an orthographic projection of the second sub source connecting part on the base substrate and an orthographic projection of the third gate line on the base substrate.

15. The display panel according to claim 5, further comprising: a transparent conducting layer on one side, away from the base substrate, of the pixel electrode; wherein
the transparent conducting layer comprises a plurality of first sub transparent conducting parts disposed at intervals; wherein an orthographic projection of one first sub transparent conducting part on the base substrate is in one first partition; in the same first partition, the orthographic projection of the first sub transparent conducting part on the base substrate covers the orthographic projection of the first through hole on the base substrate, and the orthographic projection of the first sub transparent conducting part on the base substrate is in the orthographic projection of the first pixel electrode on the base substrate; and/or,
the transparent conducting layer comprises a plurality of second sub transparent conducting parts disposed at intervals; wherein an orthographic projection of one second sub transparent conducting part on the base substrate is in one second partition; and in the same second partition, the orthographic projection of the second sub transparent conducting part on the base substrate covers the orthographic projection of the second through hole on the base substrate, and the orthographic projection of the second sub transparent conducting part on the base substrate is in the orthographic projection of the second pixel electrode on the base substrate.

16. The display panel according to claim 5, further comprising:
a first planarization layer between a layer where the reflecting electrode is located and the base substrate;
an auxiliary electrode layer between the first planarization layer and the layer where the reflecting electrode is located; and
a second planarization layer between the auxiliary electrode layer and the layer where the reflecting electrode is located; wherein
the auxiliary electrode layer comprises a plurality of first auxiliary electrodes disposed at intervals; wherein an orthographic projection of one first auxiliary electrode on the base substrate is in one first partition; in the same first partition, the orthographic projection of the first pixel electrode on the base substrate covers the orthographic projection of the first auxiliary electrode on the base substrate; and/or,
the auxiliary electrode layer comprises a plurality of second auxiliary electrodes disposed at intervals; wherein an orthographic projection of one second auxiliary electrode on the base substrate is in one second partition; and in the same second partition, the orthographic projection of the second pixel electrode on the base substrate covers the orthographic projection of the second auxiliary electrode on the base substrate.

17. The display panel according to claim 1, further comprising:
- a gate insulating layer between the source conducting layer and the base substrate; and
- the gate conducting layer between the gate insulating layer and the base substrate; wherein the gate conducting layer comprises a plurality of first gate lines, a plurality of second gate lines and a plurality of third gate lines;
- the gate conducting layer further comprises: a plurality of first compensating electrodes disposed at intervals; wherein an orthographic projection of one first compensating electrode on the base substrate is in one first partition; in the same first partition, the orthographic projection of the first pixel electrode on the base substrate covers the orthographic projection of the first compensating electrode on the base substrate, and the orthographic projection of the first compensating electrode on the base substrate has an overlapping region with the orthographic projection of the first drain electrode part of the first transistor on the base substrate; and/or,
- the gate conducting layer further comprises: a plurality of second compensating electrodes disposed at intervals; wherein an orthographic projection of one second compensating electrode on the base substrate is in one second partition; and in the same second partition, the orthographic projection of the second pixel electrode on the base substrate covers the orthographic projection of the second compensating electrode on the base substrate, and the orthographic projection of the second compensating electrode on the base substrate has an overlapping region with the orthographic projection of the second drain electrode part of the second transistor on the base substrate.

18. A display device, comprising the display panel according to claim 1.

* * * * *